(12) United States Patent
Hsiao et al.

(10) Patent No.: US 11,996,317 B2
(45) Date of Patent: May 28, 2024

(54) METHODS FOR FORMING ISOLATION REGIONS BY DEPOSITING AND OXIDIZING A SILICON LINER

(71) Applicant: Taiwan Semiconductor Manufacturing Co., Ltd., Hsinchu (TW)

(72) Inventors: Po-Kai Hsiao, Yuanlin (TW); Han-De Chen, Hsinchu (TW); Tsai-Yu Huang, Taoyuan (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 259 days.

(21) Appl. No.: 17/150,490

(22) Filed: Jan. 15, 2021

(65) Prior Publication Data
US 2022/0230908 A1 Jul. 21, 2022

(51) Int. Cl.
*H01L 21/762* (2006.01)
*H01L 21/02* (2006.01)
(Continued)

(52) U.S. Cl.
CPC .. *H01L 21/76224* (2013.01); *H01L 21/02164* (2013.01); *H01L 21/28008* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

KR 20190024567 A 3/2019
KR 20200060678 A 6/2020

OTHER PUBLICATIONS

Richard C. Jaeger, Introduction to Microelectronic Fabrication, vol. V, Addison-Wesley Publishing Company, ISBN 0-201-14695-9, pp. 30-31, May 1993. (Year: 1993).*

*Primary Examiner* — Younes Boulghassoul
(74) *Attorney, Agent, or Firm* — Slater Matsil, LLP

(57) ABSTRACT

A method includes etching a semiconductor substrate to form a trench and a semiconductor strip. A sidewall of the semiconductor strip is exposed to the trench. The method further includes depositing a silicon-containing layer extending into the trench, wherein the silicon-containing layer extends on the sidewall of the semiconductor strip, filling the trench with a dielectric material, wherein the dielectric material is on a sidewall of the silicon-containing layer, and oxidizing the silicon-containing layer to form a liner. The liner comprises oxidized silicon. The liner and the dielectric material form parts of an isolation region. The isolation region is recessed, so that a portion of the semiconductor strip protrudes higher than a top surface of the isolation region and forms a semiconductor fin.

20 Claims, 21 Drawing Sheets

(51) Int. Cl.
*H01L 21/28* (2006.01)
*H01L 21/8234* (2006.01)
*H01L 29/66* (2006.01)
*H01L 29/78* (2006.01)
*H01L 29/06* (2006.01)

(52) U.S. Cl.
CPC .............. *H01L 21/76227* (2013.01); *H01L 21/823481* (2013.01); *H01L 29/66545* (2013.01); *H01L 29/66795* (2013.01); *H01L 29/7846* (2013.01); *H01L 29/0649* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 21/76227; H01L 21/02164; H01L 21/76224; H01L 21/823481; H01L 21/823878; H01L 21/0649; H01L 21/0653; H01L 21/324; H01L 29/7846; H01L 29/0649; H01L 29/0653

See application file for complete search history.

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 10,964,548 | B2 | 3/2021 | Wang et al. |
| 11,393,711 | B2 | 7/2022 | Kao et al. |
| 2015/0200127 | A1* | 7/2015 | Chuang ............... H01L 29/0642 438/424 |
| 2018/0248015 | A1 | 8/2018 | Glass et al. |
| 2019/0067027 | A1* | 2/2019 | Wang .............. H01L 21/823821 |
| 2020/0006065 | A1 | 1/2020 | Kao et al. |
| 2020/0135551 | A1* | 4/2020 | Hsu .................. H01L 21/02271 |
| 2020/0279933 | A1 | 9/2020 | Cheng et al. |
| 2020/0295157 | A1 | 9/2020 | More et al. |

\* cited by examiner

US 11,996,317 B2

METHODS FOR FORMING ISOLATION REGIONS BY DEPOSITING AND OXIDIZING A SILICON LINER

BACKGROUND

Transistors are basic building elements in integrated circuits. Along the development path of the integrated circuits, Fin Field-Effect Transistors (FinFETs) are formed to replace planar transistors. In the formation of FinFETs, semiconductor fins are formed by forming isolation regions extending into a semiconductor substrate, and recessing the isolation regions to form semiconductor fins. Dummy gates are formed on the semiconductor fins, followed by the formation of source/drain regions. The dummy gate stacks are then removed to form trenches between the gate spacers. Replacement gates are then formed in the trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-3A, 3B, 4, 5A, 5B, 5C, 6-15, 16A, and 16B illustrate the cross-sectional views and perspective views of intermediate stages in the formation of isolation regions and a FinFET in accordance with some embodiments.

DETAILED DESCRIPTION

Figure 1:
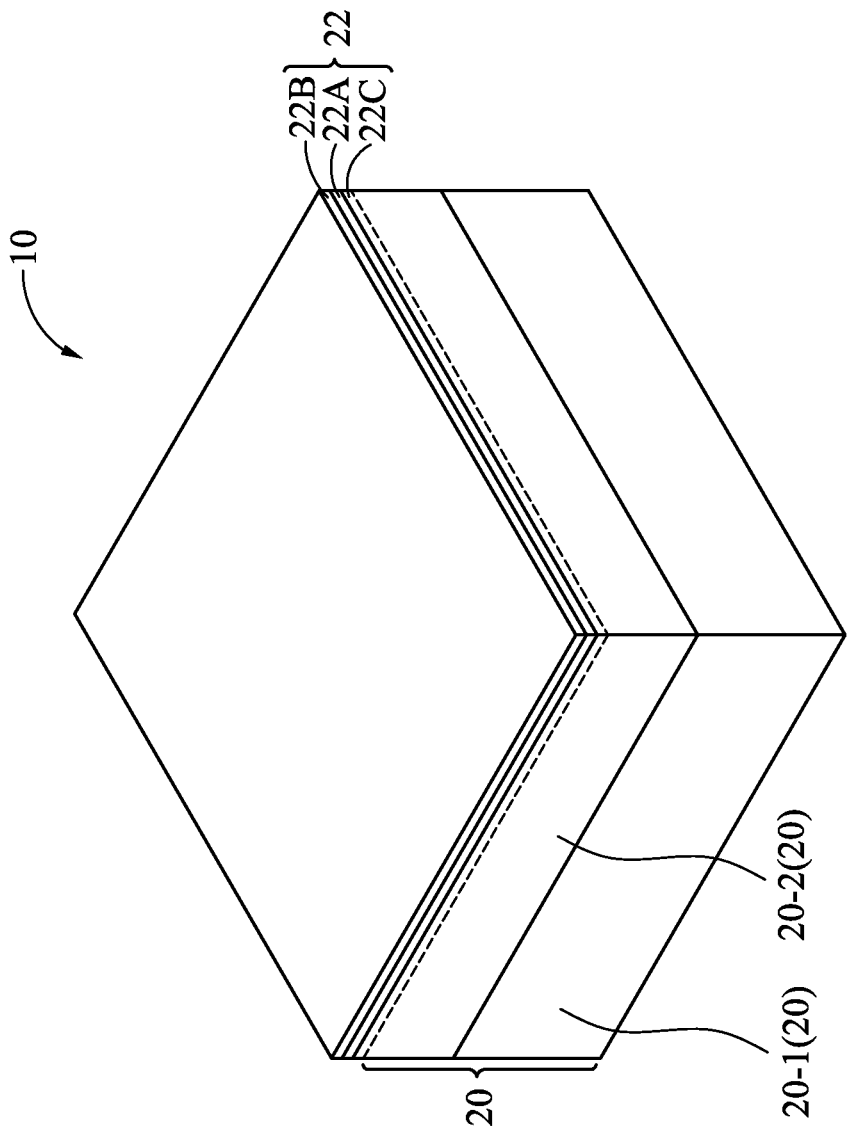

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Isolation regions, a Fin Field-Effect Transistor (FinFET) based on the isolation regions, and the method of forming the same are provided in accordance with some embodiments. The intermediate stages of forming the isolation regions and the FinFET are illustrated in accordance with some embodiments. Some variations of some embodiments are discussed. Throughout the various views and illustrative embodiments, like reference numbers are used to designate like elements. In accordance with some embodiments of the present disclosure, a silicon liner is formed, and is then oxidized in an annealing process into a silicon oxide liner. The volume increases when the silicon liner is oxidized into the silicon oxide liner. Due to the oxidation, a beneficial strain is generated in the channel of the resulting FinFET. Accordingly, SiGe channel protection, extra tensile strain and charge trapping reduction can be achieved by the introduction of Shallow Trench Isolation (STI) oxide liner.

Figure 16A:
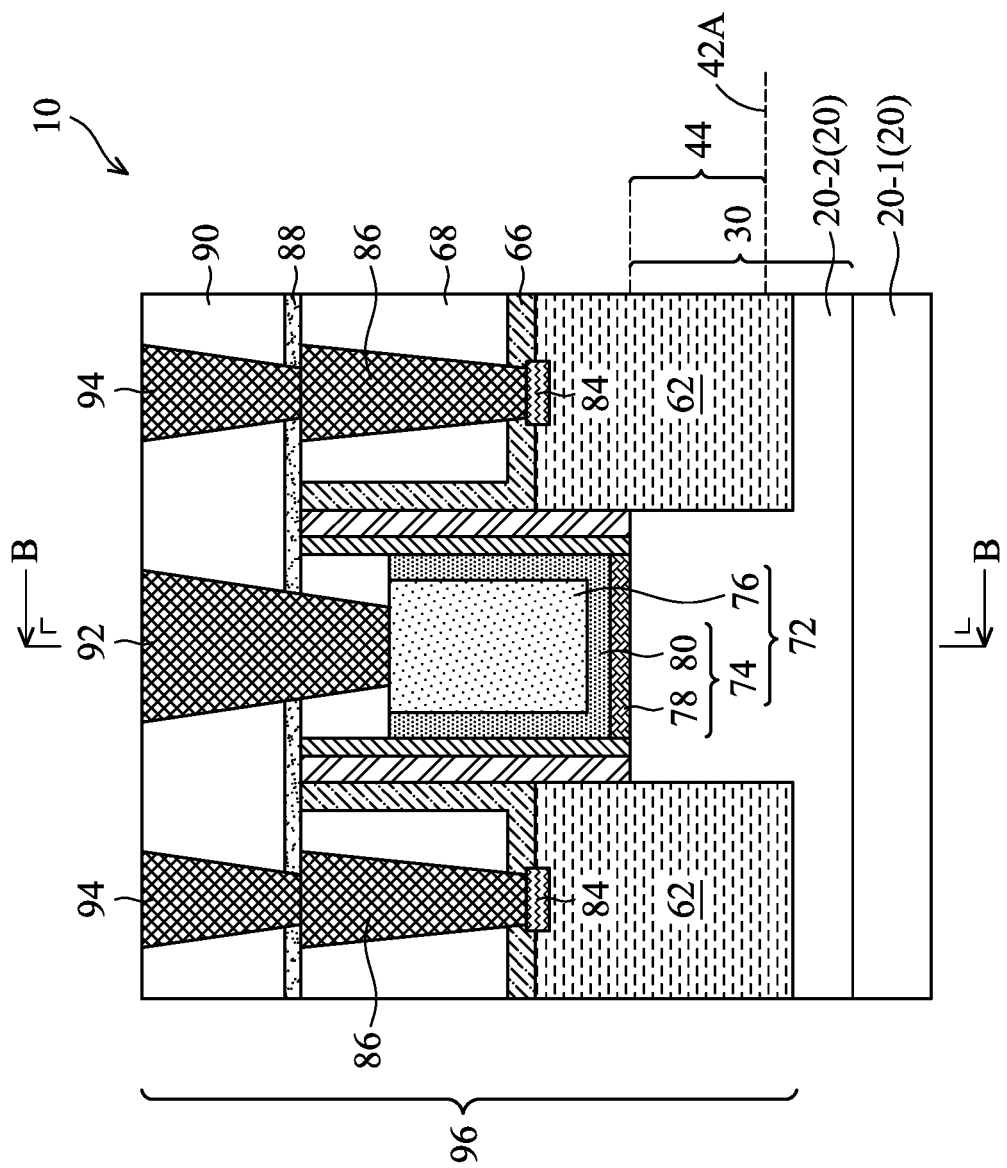
Figure 16B:
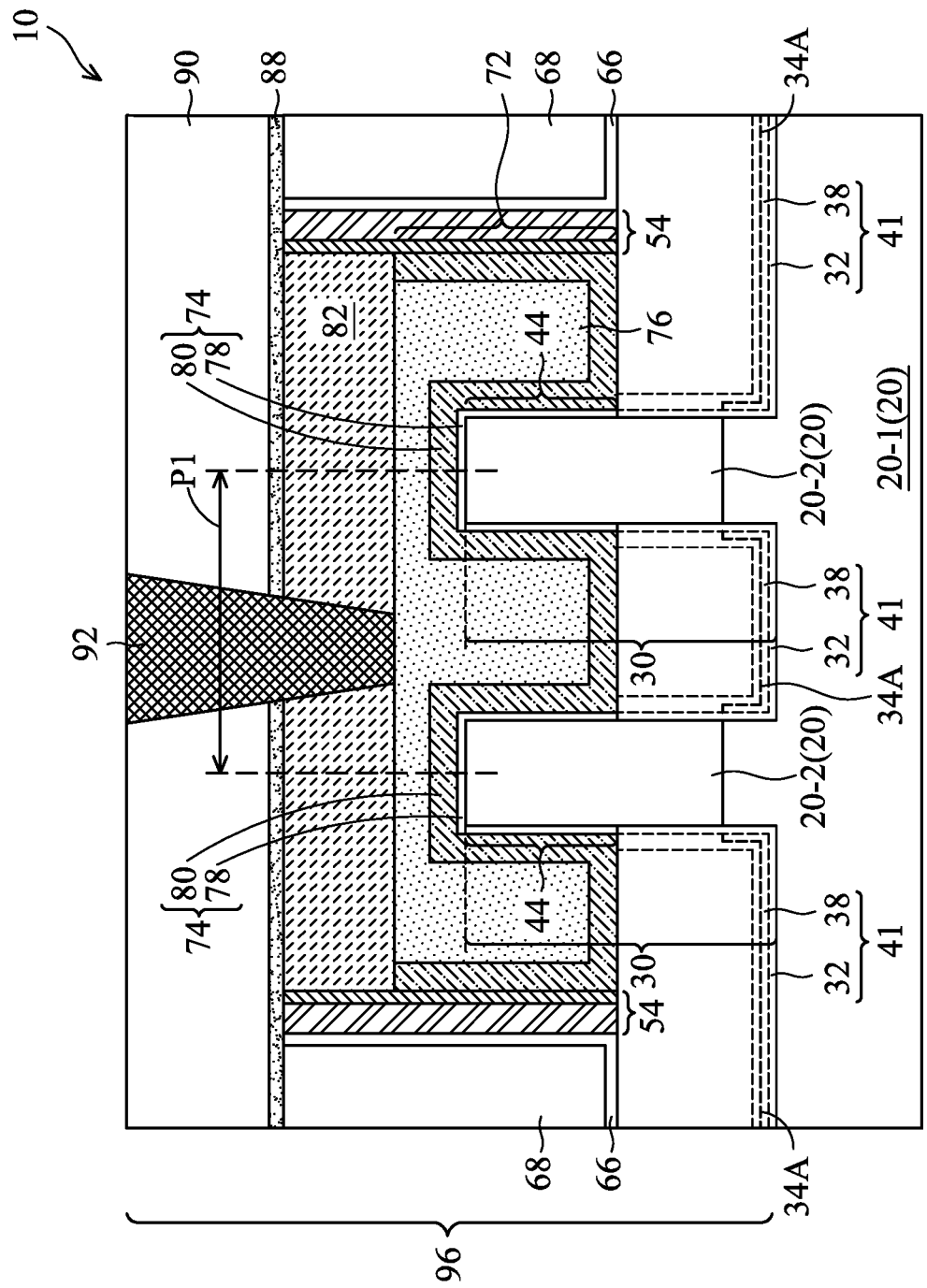
Figure 17:
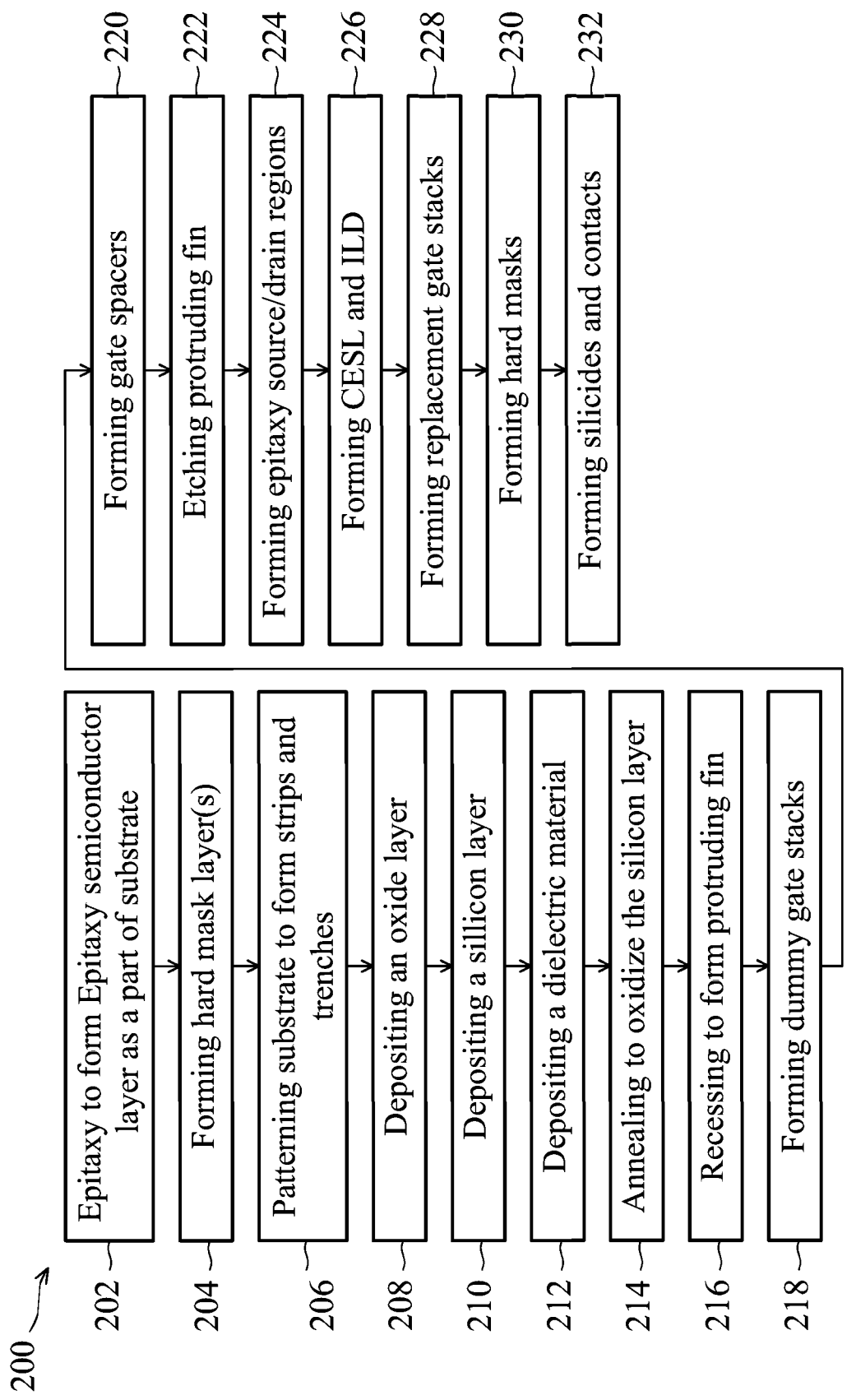
FIG. 17 illustrates a process flow for forming a FinFET in accordance with some embodiments.

FIGS. 1-4, 5A, 5B, 6-15, 16A, and 16B illustrate the perspective views and cross-sectional views of intermediate stages in the formation of isolation regions (alternatively referred to as STI regions) and a FinFET in accordance with some embodiments of the present disclosure. The corresponding processes are also reflected schematically in the process flow 200 as shown in FIG. 17.

FIG. 1 illustrates a perspective view of an initial structure. The initial structure includes wafer 10, which further includes substrate 20. Substrate 20 may be formed of silicon, silicon germanium, carbon-doped silicon, or multi-layers thereof. In accordance with some embodiments of the present disclosure, the illustrated region is a p-type device region, in which a p-type transistor such as a p-type FinFET is to be formed. Substrate 20 may include substrate (portion) 20-1 and epitaxy semiconductor layer 20-2 over substrate 20-1. Substrate 20-1 may be a bulk substrate or a semiconductor-on-insulator substrate. Silicon substrate 20-1 may be free from germanium in accordance with some embodiments, or may include silicon germanium with a germanium percentage (for example, lower than about 10 percent) lower than in epitaxy semiconductor layer 20-2. Epitaxy semiconductor layer 20-2 may be epitaxially grown on top of substrate 20-1 (which may be a silicon substrate) to form substrate 20. The respective process is illustrated as process 202 in the process flow 200 as shown in FIG. 17. In accordance with some embodiments of the present disclosure, epitaxy semiconductor layer 20-2 is formed of or comprises silicon germanium (SiGe) or germanium (without silicon therein). The germanium atomic percentage in epitaxy semiconductor layer 20-2 is higher than the germanium atomic percentage in substrate 20-1. In accordance with some embodiments of the present disclosure, the atomic percentage in epitaxy semiconductor layer 20-2 is in the range between about 30 percent and 100 percent. Epitaxy semiconductor layer 20-2 may also be formed of SiP, SiC, SiPC, SiGeB, or a III-V compound semiconductor such as InP, GaAs, AlAs, InAs, InAlAs, InGaAs, or the like.

In accordance with alternative embodiments of the present disclosure, on the same wafer, an n-type device is provided, in which an n-type transistor such as an n-type FinFET is to be formed. The substrate in the n-type device region may include a silicon substrate (for example, the same as 20-1), and may be free from the epitaxy layer 20-2 formed on the silicon substrate.

Hard mask layer 22 is formed over semiconductor substrate 20. The respective process is illustrated as process 204 in the process flow 200 as shown in FIG. 17. In accordance with some embodiments, hard mask layer 22 includes hard mask (sub) layer 22A and hard mask (sub) layer 22B over hard mask layer 22A. Hard mask layer 22A may be a thin film formed of silicon oxide, and is sometimes referred to as a pad oxide layer. In accordance with some embodiments of the present disclosure, pad oxide layer 22A is formed through a deposition process, which may include Chemical Vapor Deposition (CVD), Atomic Layer Deposition (ALD), or the like. In accordance with alternative embodiments, pad oxide layer 22A is formed through a thermal oxidation process, wherein a top surface layer of semiconductor substrate 20 is oxidized. Pad oxide layer 22A acts as an adhesion layer between semiconductor substrate 20 and hard mask layer 22B. Hard mask layer 22A may also act as an etch stop layer for etching hard mask layer 22B. In accordance with some embodiments of the present disclosure, hard mask layer 22B is formed of silicon nitride, for example. The formation method may include Low-Pressure Chemical Vapor Deposition (LPCVD), Plasma Enhanced Chemical Vapor Deposition (PECVD), or the like. Hard mask layer 22B is used as a hard mask during subsequent photolithography processes.

In accordance with alternative embodiments, hard mask layer 22 is formed of a homogeneous material in contact with substrate 20. For example, the homogeneous material may include silicon nitride or the like materials such as SiCN, SiOC, or the like. In accordance with yet alternative embodiments, hard mask layer 22 comprises silicon layer 22C, pad oxide layer 22A over silicon layer 22C, and hard mask layer 22B over pad oxide layer 22A. The silicon layer 22C may be formed through deposition, for example, using CVD, ALD, or the like. Silicon layer 22C may be a crystalline silicon layer.

Figure 2:
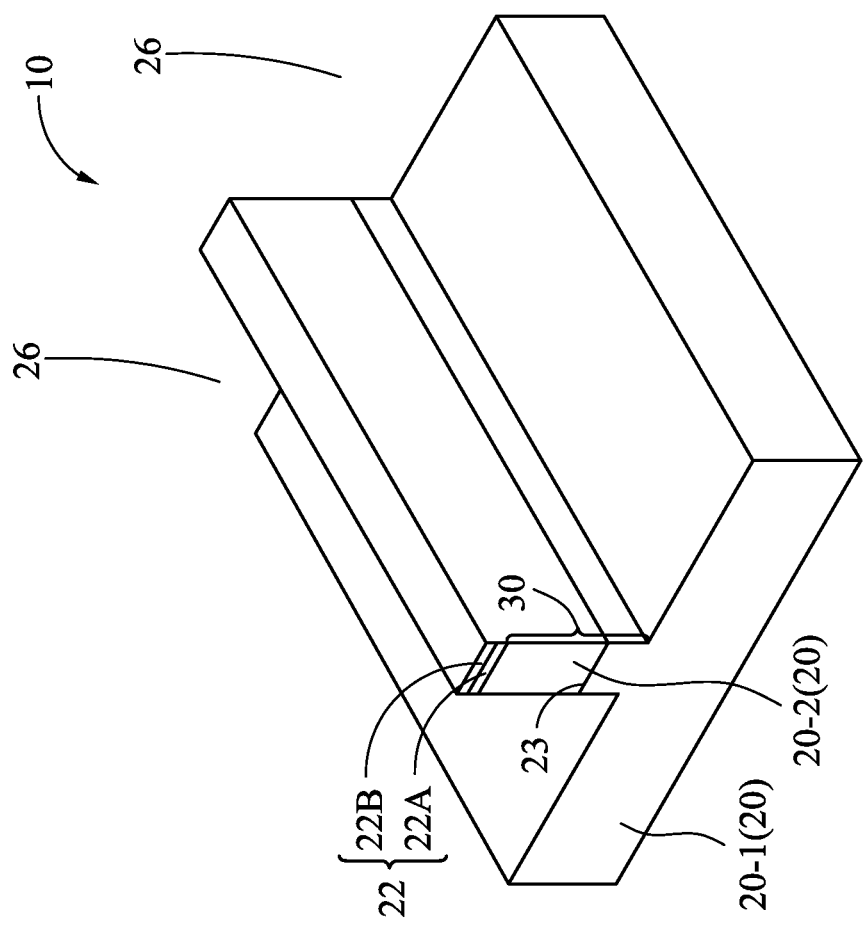

Referring to FIG. 2, hard mask layer 22 is patterned, for example, etched by using a patterned photo resist (not shown) as an etching mask, so that the underlying semiconductor substrate 20 is exposed. The exposed semiconductor substrate 20 is then etched using the patterned hard mask layer 22 as an etching mask, forming trenches 26. The respective process is illustrated as process 206 in the process flow 200 as shown in FIG. 17. The portions of semiconductor substrate 20 between neighboring trenches 26 are referred to as semiconductor strip 30 hereinafter. Some portions of trenches 26 may have the shape of strips (when viewed in the top view of wafer 10) that are parallel to each other, and trenches 26 are closely located from each other. In accordance with some embodiments of the present disclosure, the aspect ratio (the ratio of depth to width) of trenches 26 is greater than about 7, and may be greater than about 10. Although one semiconductor strip 30 is illustrated, a plurality of semiconductor strips 30 may be formed as being parallel to each other, with trenches 26 separating the plurality of semiconductor strips 30 from each other. In accordance with some embodiments in which epitaxy semiconductor layer 20-2 is formed, the bottoms of trenches 26 are lower than the interface 23 between substrate portion 20-1 and epitaxy semiconductor layer 20-2.

Figure 3A:
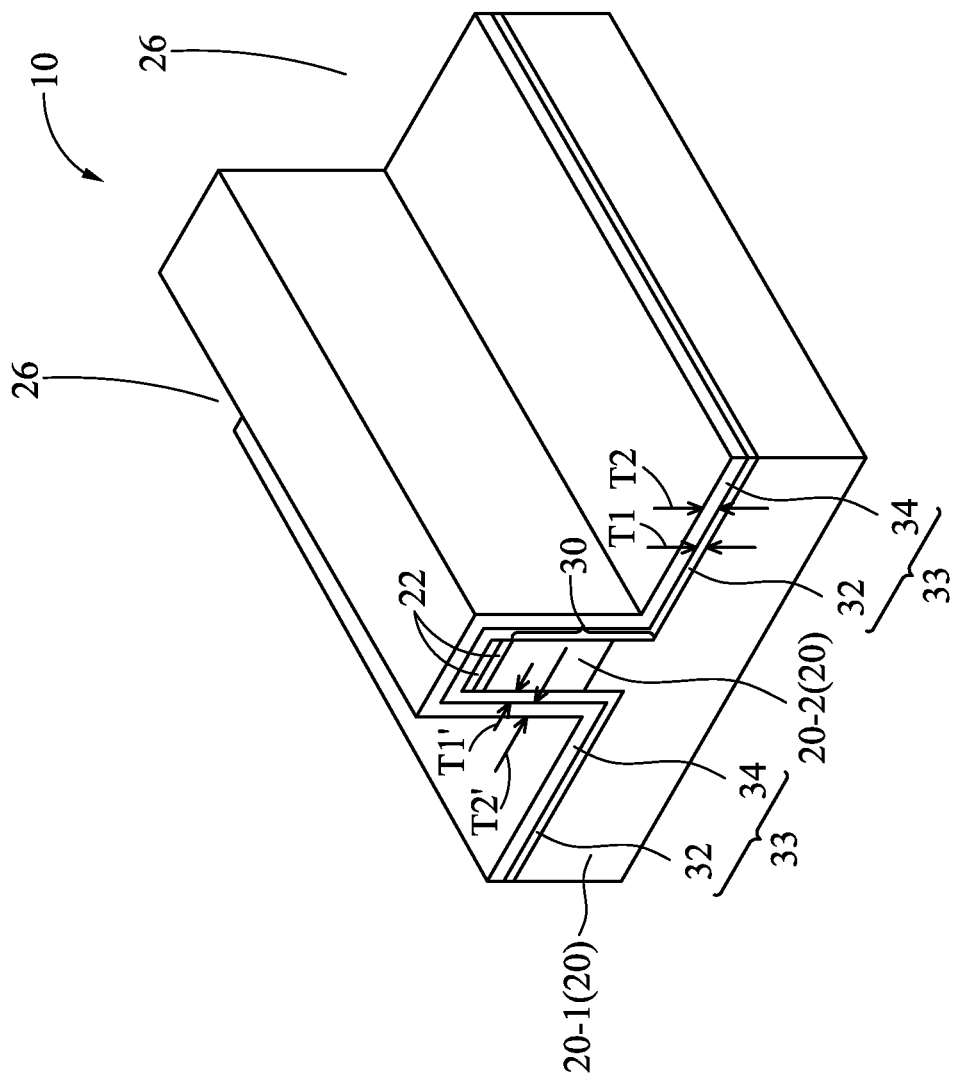

Referring to FIG. 3A, oxide layer 32 is formed in accordance with some embodiments of the present disclosure. The respective process is illustrated as process 208 in the process flow 200 as shown in FIG. 17. Throughout the description, oxide layer 32 is alternatively referred to as a silicon oxide liner. In accordance with some embodiments, oxide layer 32 is formed through a conformal deposition process such as an ALD process, a CVD process, or the like. Accordingly, oxide layer 32 has horizontal portions and vertical portions, with the thickness T1 of the horizontal portions and the thickness T1' of the vertical portions being equal to each other or substantially equal to each other. For example, the absolute value of ratio (T1'−T1)/T1 may be smaller than about 0.2 or smaller than about 0.1. When ALD is used, precursors such as Dichlorosilane (DCS, $SiH_2Cl_2$), silane ($SiH_4$), disilane ($Si_2H_6$), hexamethyldisilane (HMDS), or the like may be pulsed and then purged, followed by the pulsing and the purging of another process gas such as $O_2$, $O_3$, or the like, so that an atomic layer of silicon oxide layer is deposited. The two types of gases are pulsed and purged alternatingly to increase the thickness of the oxide layer to a desirable value. The thickness of oxide layer 32 is thick enough to allow oxide layer 32 to be an effective barrier for protecting semiconductor strip 30 from being oxidized, so that the oxidation of the subsequently deposited silicon layer 34 is easier to control. On the other hand, oxide layer 32 cannot be too thick. Otherwise, the strain generated from the oxidation of the subsequently deposited silicon layer 34 cannot be effectively applied on semiconductor strip 30. In accordance with some embodiments, the thicknesses T1 and T1' of oxide layer 32 are in the range between about 5 Å and about 15 Å. The ALD process may be a thermal ALD process performed, for example, at temperatures in a range between about 250° C. and 450° C. When CVD is used, precursors such as silane, disilane, HMDS, DCS, $O_2$, $O_3$, or the like, may be used. In accordance with some embodiments of the present disclosure, by using silicon oxide layer rather than silicon nitride layer as barriers, silicon nitride, which has high density of traps (DIT) and is prone to trapping charges, which leads to higher leakage currents, is not used, while the silicon oxide layer, which has lower DIT and higher bandgap, is used.

Further referring to FIG. 3A, silicon layer 34 is deposited on oxide layer 32 in accordance with some embodiments of the present disclosure. Throughout the description, silicon layer 34 is alternatively referred to as a silicon liner. The respective process is illustrated as process 210 in the process flow 200 as shown in FIG. 17. The deposition may be performed through a conformal deposition process such as a CVD process or an ALD process. When ALD is used, precursors such as DCS, silane, disilane, HMDS, or the like may be pulsed and purged, followed by the pulsing and purging of another process gas such as $H_2$. The two types of gases are pulsed and purged alternatingly to increase the thickness of the silicon layer to a desirable thickness. The ALD process may be a thermal ALD process, which is performed, for example, at temperatures in a range between about 350° C. and about 500° C. When CVD is used, precursors such as silane, disilane, HMDS, DCS, $H_2$, or the like, may be used.

Silicon layer 34 may be free or substantially free from other elements such as germanium, carbon, or the like. For example, the atomic percentage of silicon in silicon layer 34 may be higher than about 95 percent or higher than about 99 percent. Silicon layer 34 may be formed as an amorphous silicon layer, a crystalline silicon layer, or a polysilicon layer, which may be achieved, for example, by adjusting the temperature and the growth rate in the deposition process. Silicon layer 34 has horizontal portions and vertical portions, with the thickness T2 of the horizontal portions and the thickness T2' of the vertical portions being equal to each other or substantially equal to each other. For example, the absolute value of ratio (T2'−T2)/T2 may be smaller than about 0.2 or smaller than about 0.1. Thicknesses T2 and T2' of silicon layer 34 may be greater than about 0.5 nm, so that adequate strain may be generated in the subsequent oxidation of silicon layer 34. On the other hand, the thicknesses T2 and T2' are not to be too high to avoid introducing too much strain. In accordance with some embodiments, the thickness of silicon layer 34 may be in the range between about 0.5 nm and about 2 nm. It is appreciated that the optimum thickness T2 and T2' are related to the pitch of neighboring semiconductor strips 30, as will be discussed in subsequent paragraphs. Throughout the description, oxide layer 32 and silicon layer 34 are collectively referred to as liners 33.

When the embodiments in FIG. 3A is adopted, in which oxide layer 32 is deposited before the deposition of silicon layer 34, the silicon oxide hard mask layer 22A can be omitted or separated from epitaxy semiconductor material 20-2. For example, hard mask layer 22 may either be formed of a homogeneous material such as silicon nitride, or may have the structure including silicon layer 22C (FIG. 1) contacting epitaxy semiconductor material 20-2, pad oxide layer 22A over silicon layer 22C, and hard mask layer 22B over pad oxide layer 22A. If a pad oxide layer is in direct contact with the material (such as SiGe) of epitaxy semiconductor material 20-2, there may be serious oxidation at the interface between the pad oxide layer and epitaxy semiconductor material 20-2, especially at locations where the interface joins silicon oxide layer 32.

Figure 3B:
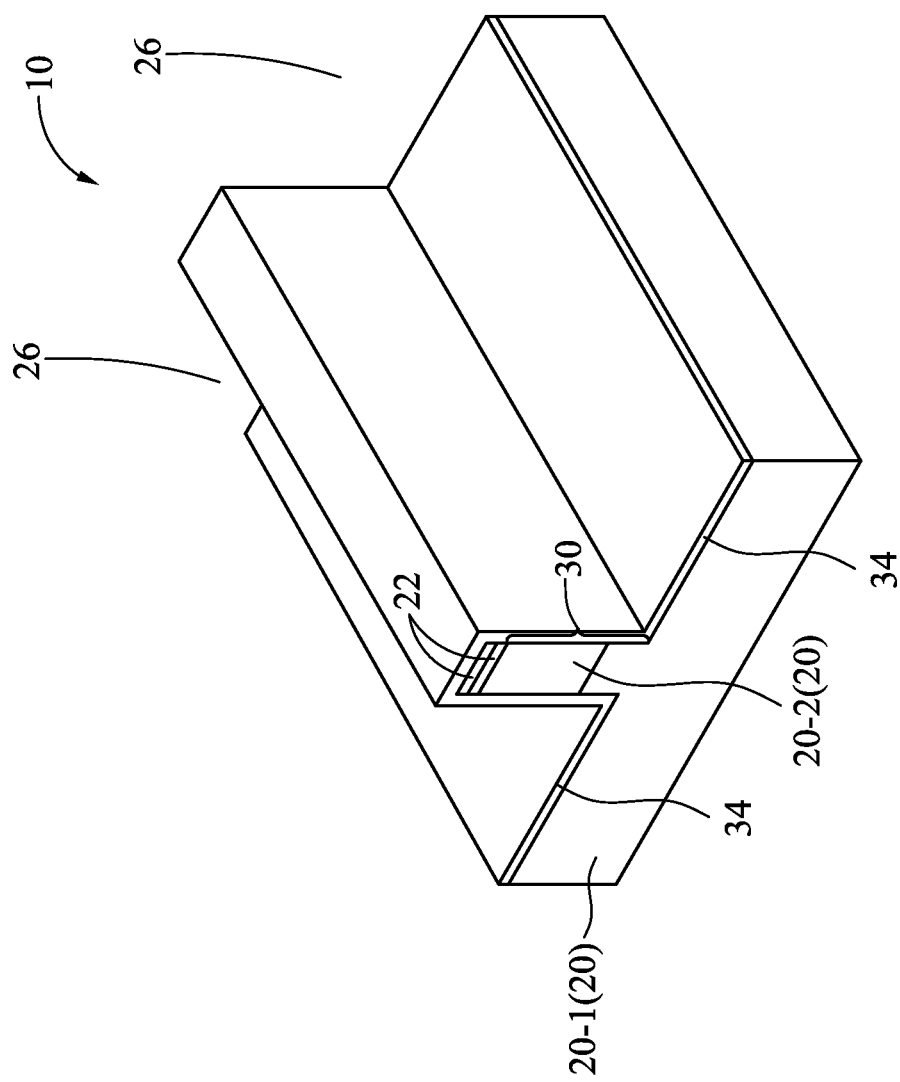

FIG. 3B illustrates the deposition of a liner in accordance with alternative embodiments. In these embodiments, instead of depositing oxide layer 32 before depositing silicon layer 34, silicon layer 34 is deposited directly on the hard mask layers 22, semiconductor substrate 20 and semiconductor strip 30. Accordingly, silicon layer 34 is in physical contact with the sidewalls of semiconductor strip 30 and the exposed top surface of semiconductor substrate 20.

Silicon layer 34 may be deposited using ALD, CVD, or the like, hence is formed as a conformal layer. Accordingly, the horizontal thickness T2 (FIG. 3A) of the horizontal portions and the thickness T2' of the vertical portions are equal to each other or substantially equal to each other, for example, with the absolute value of ratio (T2'−T2)/T2 being smaller than about 0.2 or smaller than about 0.1. Thicknesses T2 and T2' of silicon layer 34 may be greater than about 0.5 nm, and may be in the range between about 0.5 nm and about 2 nm, so that a desirable strain may be applied by the subsequent oxidation of silicon layer 34.

Figure 4:
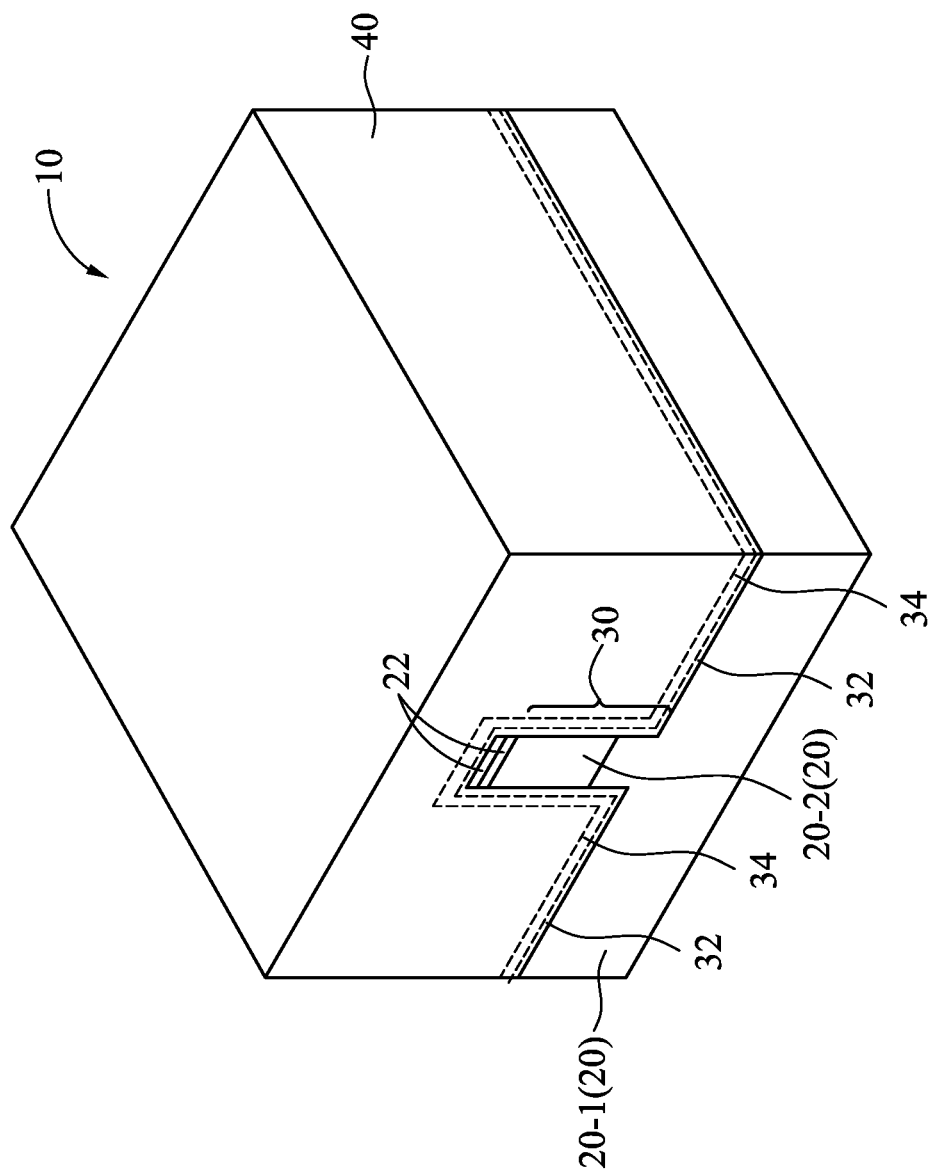

Dielectric material 40 is then deposited to fill the remaining portions of trenches 26, resulting in the structure shown in FIG. 4. The respective process is illustrated as process 212 in the process flow 200 as shown in FIG. 17. The formation method of dielectric material 40 may be selected from Flowable Chemical Vapor Deposition (FCVD), spin-on coating, CVD, ALD, High-Density Plasma Chemical Vapor Deposition (HDPCVD), Low Pressure CVD (LPCVD), and the like.

In accordance with some embodiments in which FCVD is used, a silicon- and nitrogen-containing precursor (for example, trisilylamine (TSA), disilylamine (DSA), or the like), is used, and hence the resulting dielectric material 40 is flowable as deposited. In accordance with alternative embodiments of the present disclosure, the flowable dielectric material 40 is formed using an alkylamino silane based precursor. During the deposition, plasma is turned on to activate the gaseous precursors for forming the flowable oxide. Dielectric material 40 is deposited until its top surface is higher than the top surfaces of hard mask layers 22.

Figure 5A:
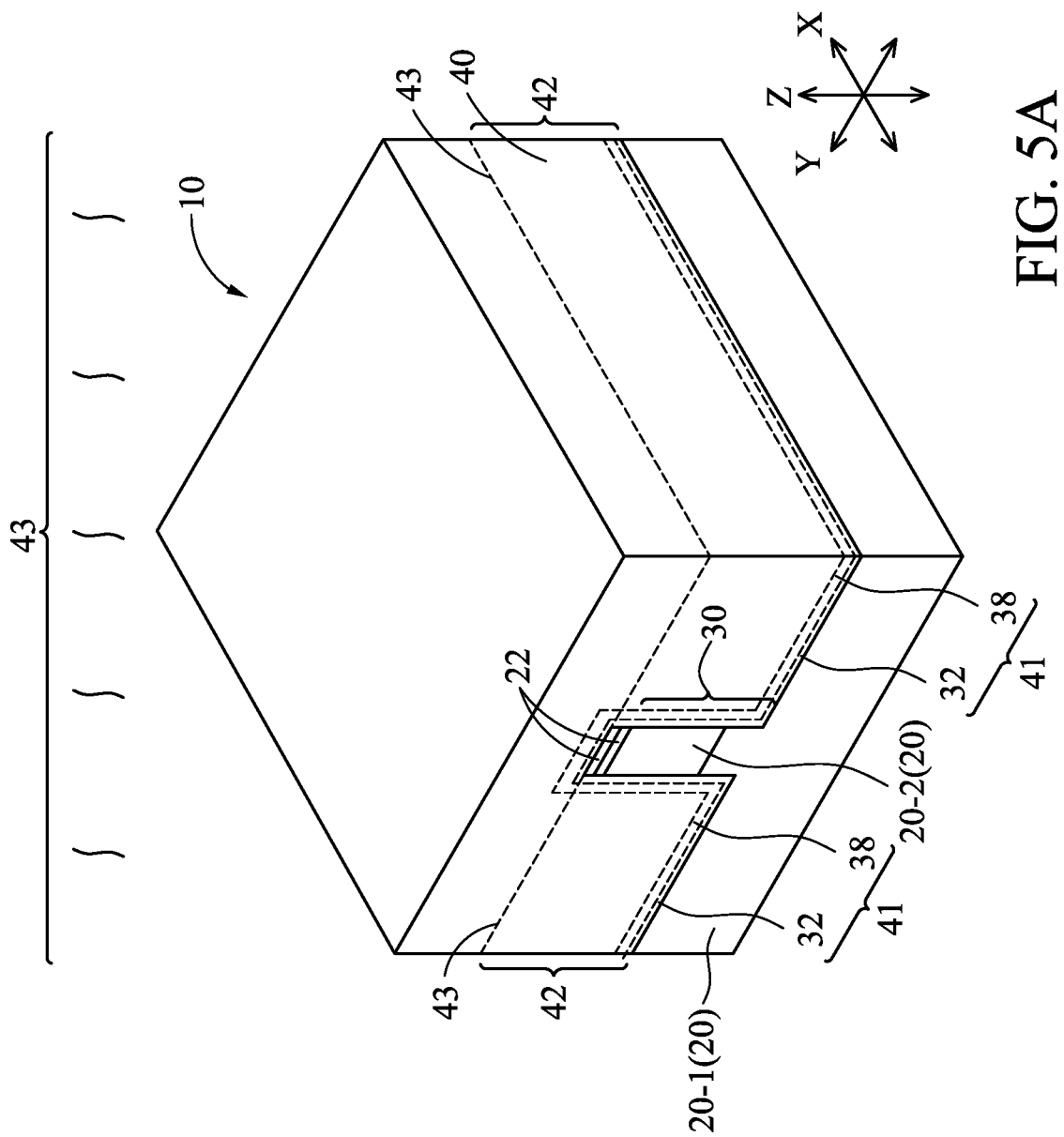

Referring to FIG. 5A, after dielectric material 40 is deposited, an annealing (curing) process 43 is performed, which converts flowable dielectric material 40 into a solid dielectric material, and oxidizes silicon layer 34. The respective process is illustrated as process 214 in the process flow 200 as shown in FIG. 17. The solidified dielectric material is also referred to as dielectric material 40. In accordance with some embodiments of the present disclosure, the annealing process is performed in an oxygen-containing environment. The annealing temperature may be higher than about 200° C., for example, in a temperature range between about 550° C. and about 700° C. The duration of the annealing process may be in the range between about 1 hour and about 3 hours. During the annealing process, an oxygen-containing process gas is conducted into the process chamber in which wafer 10 is placed. The oxygen-containing process gas may include oxygen ($O_2$), ozone ($O_3$), or combinations thereof. Water steam ($H_2O$), which also provides oxygen, may also be used. The annealing process may be performed in an oven, with the pressure being one atmosphere. In accordance with other embodiments, the annealing process is performed in a vacuum chamber, with the oxygen-containing process gas being conducted. The flow rate of the oxygen-containing process gas may be in the range between about 100 sccm and about 1,000 sccm, for example. As a result of the oxygen-containing process gas, dielectric material 40 is cured and solidified. The resulting dielectric material 40 may be an oxide such as silicon oxide.

Figure 5B:
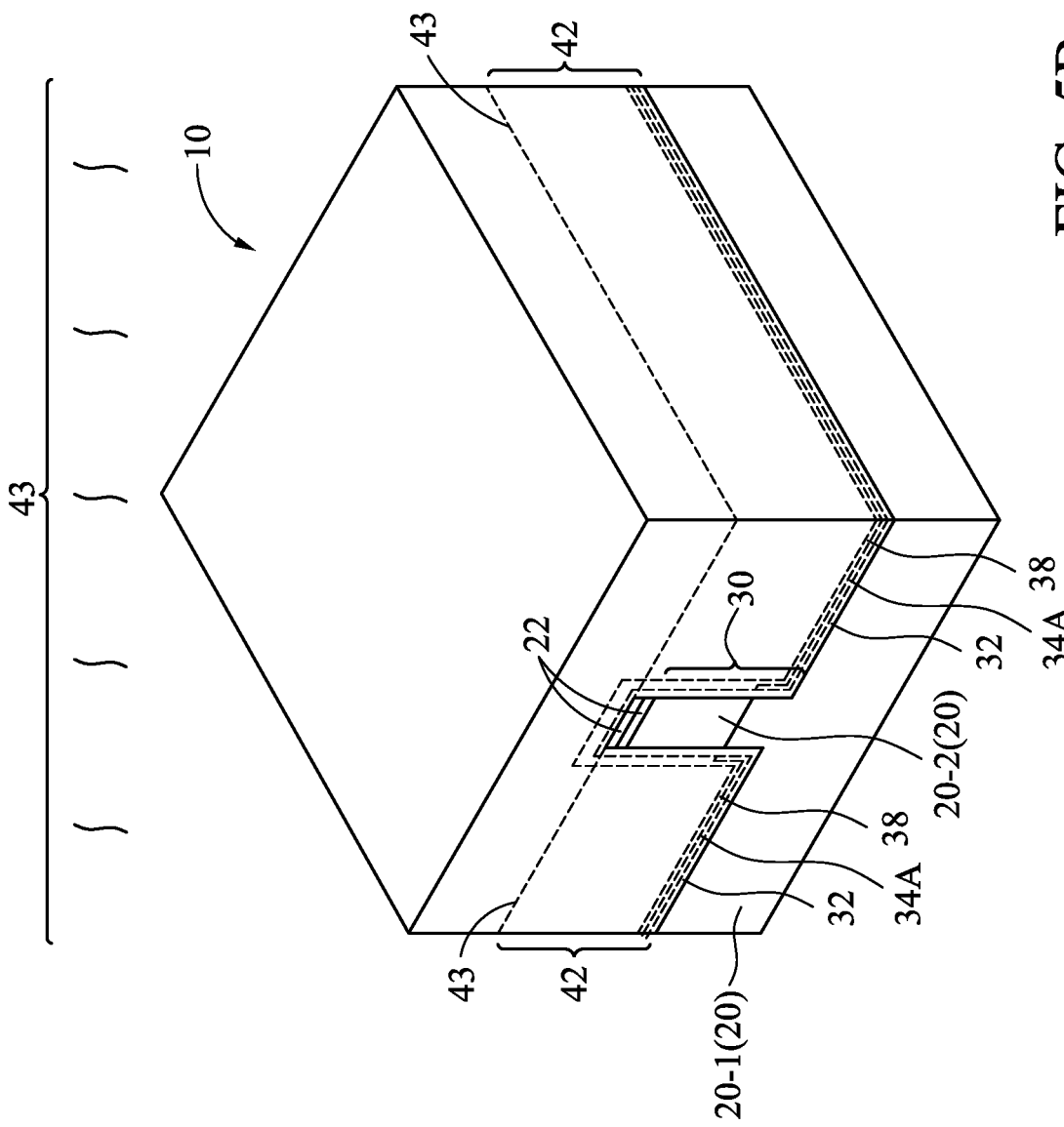
Figure 5C:
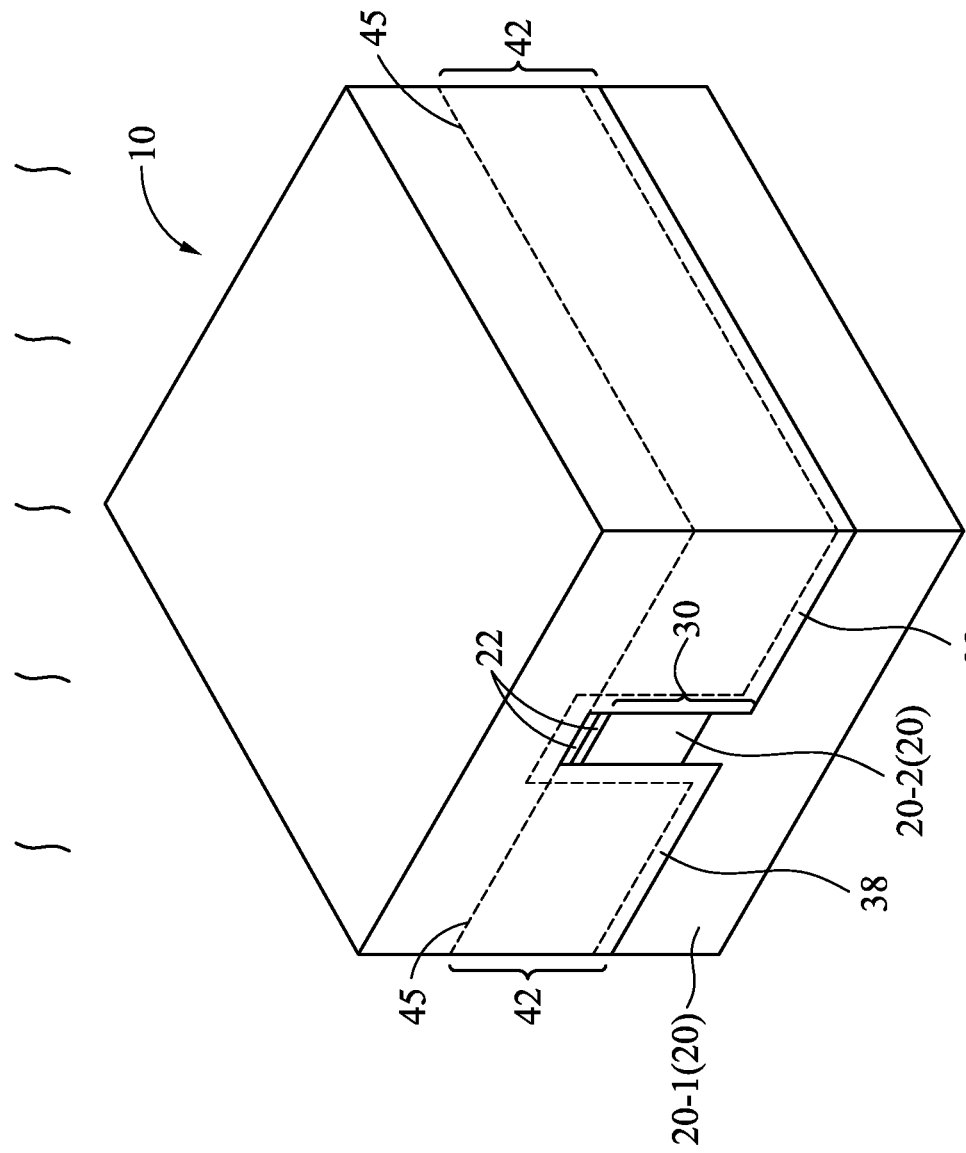

The annealing process is performed with the temperature and the duration (for example, as aforementioned) selected, so that silicon layer 34 is oxidized and converted into silicon oxide layer (liner) 38, as shown in FIG. 5A. As a result, silicon oxide layer 38 comprises a horizontal portion directly underlying and in physical contact with dielectric material 40, and sidewall portions on the sidewalls of dielectric material 40. In accordance with some embodiments in which silicon oxide layer 32 is formed (as shown in FIG. 5A), silicon oxide layer 38 is between, and is in contact with, silicon oxide layer 32 and dielectric material 40. Silicon oxide layers 32 and 38 are collectively referred to as silicon oxide liner (layer) 41 hereinafter. In accordance with alternative embodiments in which silicon oxide layer 32 is not formed (as shown in FIG. 5C), silicon oxide layer 38 is in contact with semiconductor substrate 20 and semiconductor strips 30.

It is appreciated that depending on the material and the composition (elements and the percentage of elements), silicon oxide layer 38 may be, or may not be, distinguishable from silicon oxide layer 32 and dielectric material 40. For example, dielectric material 40, in additional to silicon and oxygen, may or may not include other elements such as carbon, hydrogen, nitrogen, or the like. Furthermore, the density of silicon oxide layer 32 and silicon oxide layer 38 may be lower than, equal to, or higher than that of dielectric material 40. The distinction between silicon oxide layers 32 and 38 from dielectric material 40 may be achieved by determining the elements and the corresponding atomic percentages of the elements in these layers/materials, for example, by using X-ray Photoelectron Spectroscopy (XPS).

Figure 15:
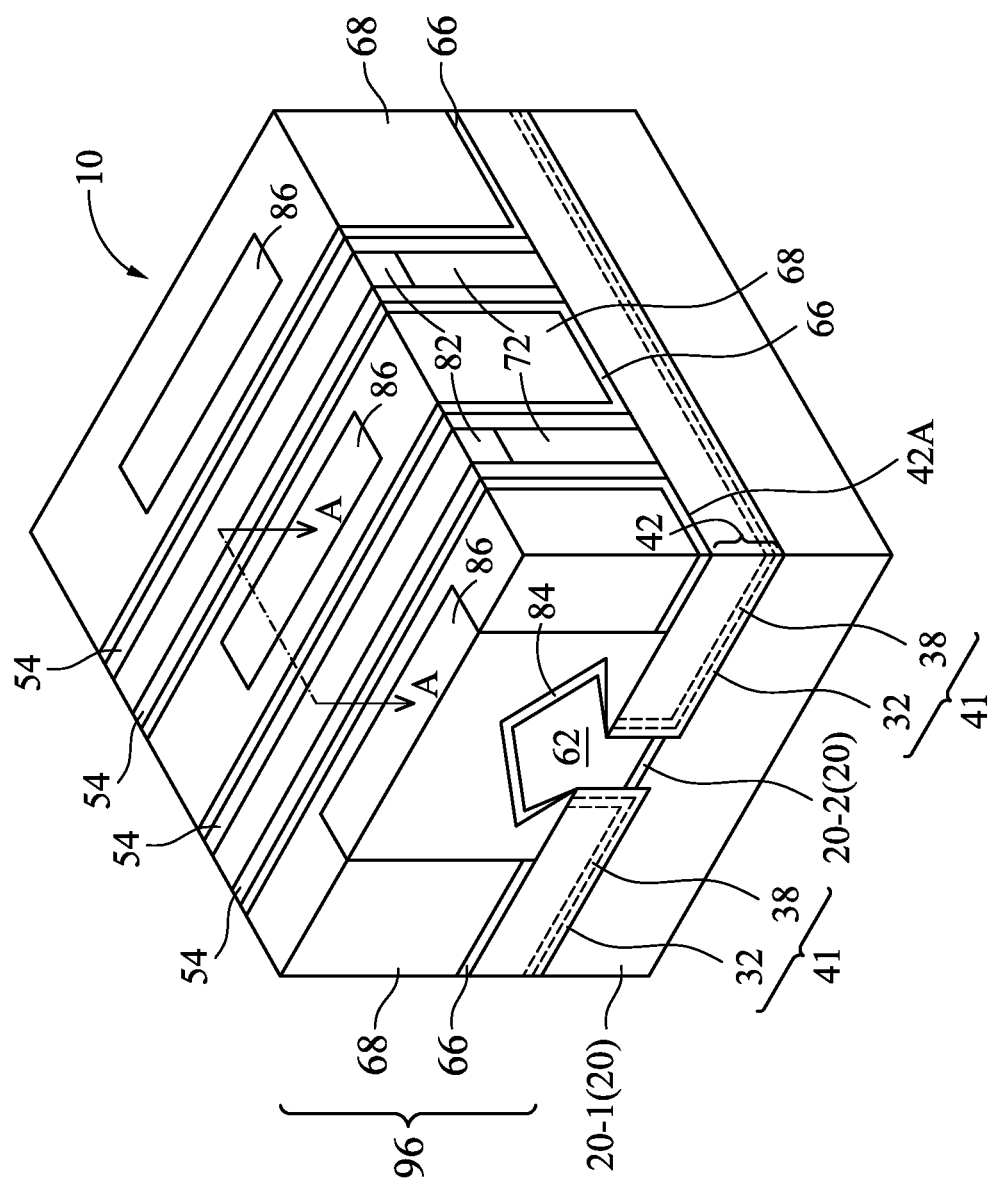

In accordance with some embodiments, when silicon layer 34 is thick, but the annealing temperature is not high enough, and/or the anneal duration is not long enough to oxidize the whole silicon layer 34, there may be a bottom portion of silicon layer 34 remaining un-oxidized. The remaining portions are referred to as portions 34A, as illustrated in FIG. 5B. In accordance with some embodiments as shown in FIG. 5B, since the top parts of silicon layer 34 receive oxygen earlier than lower parts, it is possible that the top parts close to the top surface of wafer 10 are oxidized, while the lower parts are not, so that the un-oxidized portions 34A have the profile as shown in FIG. 5B. The un-oxidized silicon portions 34A may be oxidized by subsequent thermal budget in the formation of the respective semiconductor wafer (whole un-oxidized silicon portions 34A is oxidized into silicon oxide layer 38 thereafter), or may be left in the final structure, for example, in the FinFET 96 as shown in FIGS. 15, 16A, and 16B.

A planarization process such as a Chemical Mechanical Polish (CMP) process or a mechanical grinding process may be performed to level the top surface of dielectric material 40. In the planarization process, hard masks 22 may be used as a stop layer. The remaining dielectric material 40 and dielectric layers 32 and 38 after the planarization process are collectively referred to as isolation regions 42, which are also referred to as Shallow Trench Isolation (STI) regions 42. Lines 45 illustrate the corresponding top surfaces of isolation regions 42 after planarization.

In accordance with some embodiments, the oxidation of silicon layer 34 is achieved before the planarization process, hence the oxidation of silicon layer 34 and the full solidification of dielectric material 40 are performed in the same annealing process. In accordance with alternative embodiments, the solidification of dielectric material 40 is performed before the planarization process. In such a case, dielectric material 40 may be partially solidified to a degree that the CMP process may be performed. The CMP process may remove the top portion of dielectric material 40, so that it is easier to fully convert the remaining dielectric material 40, for example, into silicon oxide, and it is easier to oxidize silicon layer 34 as silicon oxide layer 38 with less thermal budget. In accordance with these embodiments, in the partial solidification, silicon layer 34 may remain not oxidized, or may be partially oxidized with some portions (for example, the bottom portions 34A as shown in FIG. 5B) of silicon oxide layer 34 remaining. The annealing process performed after the CMP process may fully solidify dielectric material 40, and fully oxidize silicon layer 34 into silicon oxide layer 38.

In accordance with some embodiments in which dielectric material 40 is formed of non-flowable material using, for example, CVD, PECVD, or the like, the annealing process may be performed before or after the planarization process.

In accordance with some embodiments, through the deposition and the oxidation of silicon layer 34, strains to the channels of the corresponding FinFETs 96 are improved. When silicon is oxidized to form silicon oxide, the volume of the silicon oxide is 2.25 times the volume of silicon. Accordingly, the expanded volume causes the squeeze in the Y-direction toward the semiconductor strips 30 (FIG. 5A). Since the volume of semiconductor strip 30 is fixed, when squeezed, a tensile stress is generated in semiconductor strip 30 along the Y-direction. The performance of the resulting FinFET 96 (FIG. 15) is thus improved. Experiment results performed on silicon wafers indicate that by adopting the embodiments of the present disclosure, the tensile stress may be improved by 0.3%. It is appreciated that to generate the strain, the oxidation process needs to be performed after the depositing of dielectric material 40. Otherwise, the expansion is toward free spaces, and no strain or very small strain is generated. Furthermore, the generated strain is related to both of the thickness of silicon layer 34 and the pitch P1 (FIG. 16B) of neighboring semiconductor strips 30, and the thicker the silicon layer 34 and/or the smaller the pitch P1 is, the greater the strain is generated. For example, when the thickness of silicon layer 32 is in the range between about 0.5 nm and about 1.5 nm, the pitch P1 is smaller than about 25 nm or smaller than about 20 nm to be able to result in noticeable strain improvement.

Figure 6:
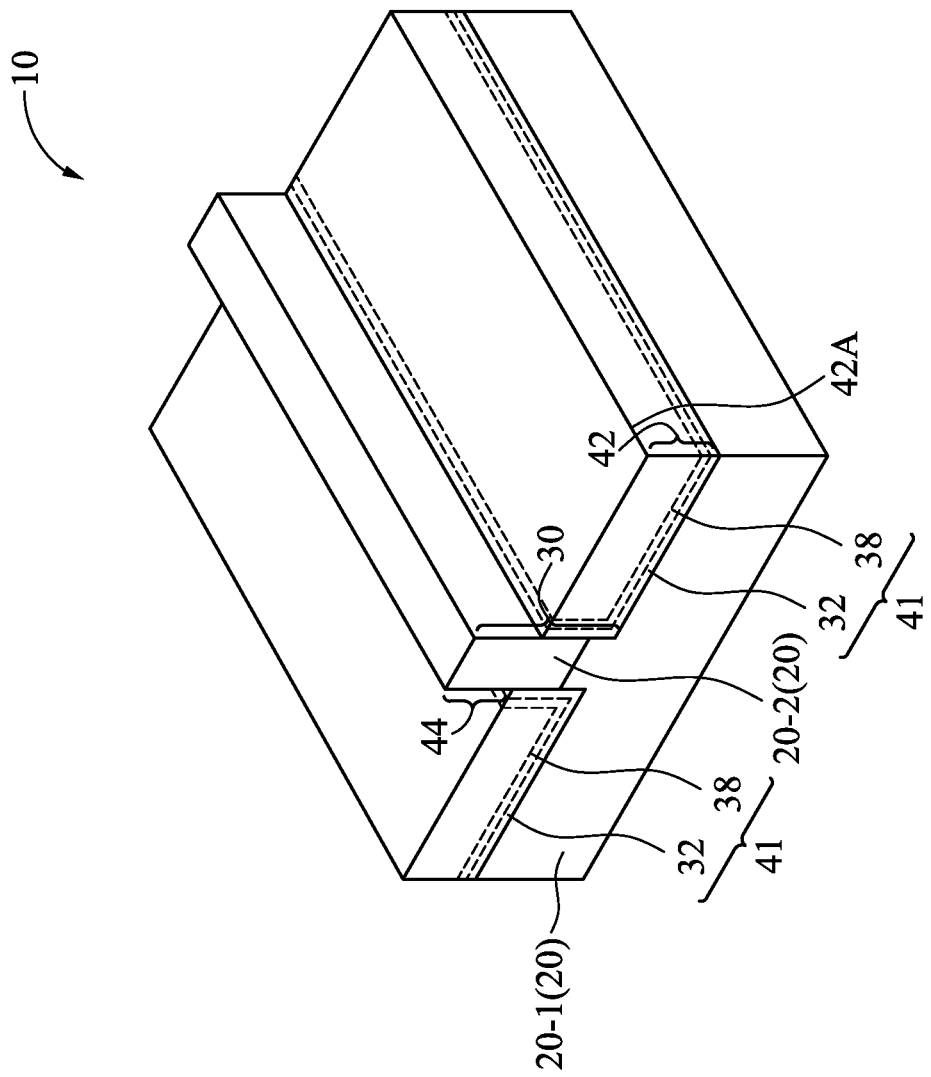

Next, as shown in FIG. 6, isolation regions 42 are recessed in an etching process. The respective process is illustrated as process 216 in the process flow 200 as shown in FIG. 17. The portion of semiconductor strip 30 higher than the top surfaces of the remaining isolation regions 42 are referred to as protruding (semiconductor) fin 44. In accordance with some embodiments of the present disclosure, the top surfaces of isolation regions 42 are higher than the interface 23 between epitaxy layer 20-2 (if formed) and the underlying substrate portion 20-1. The recessing of the dielectric regions may be performed using a dry etch process. For example, $HF_3$ and $NH_3$ may be used as the etching gases. In accordance with alternative embodiments of the present disclosure, the recessing of the dielectric regions is performed using a wet etching process. The etching chemical may include diluted HF solution, for example.

In above-illustrated embodiments, semiconductor fins may be formed by any suitable method. For example, the semiconductor fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 7:
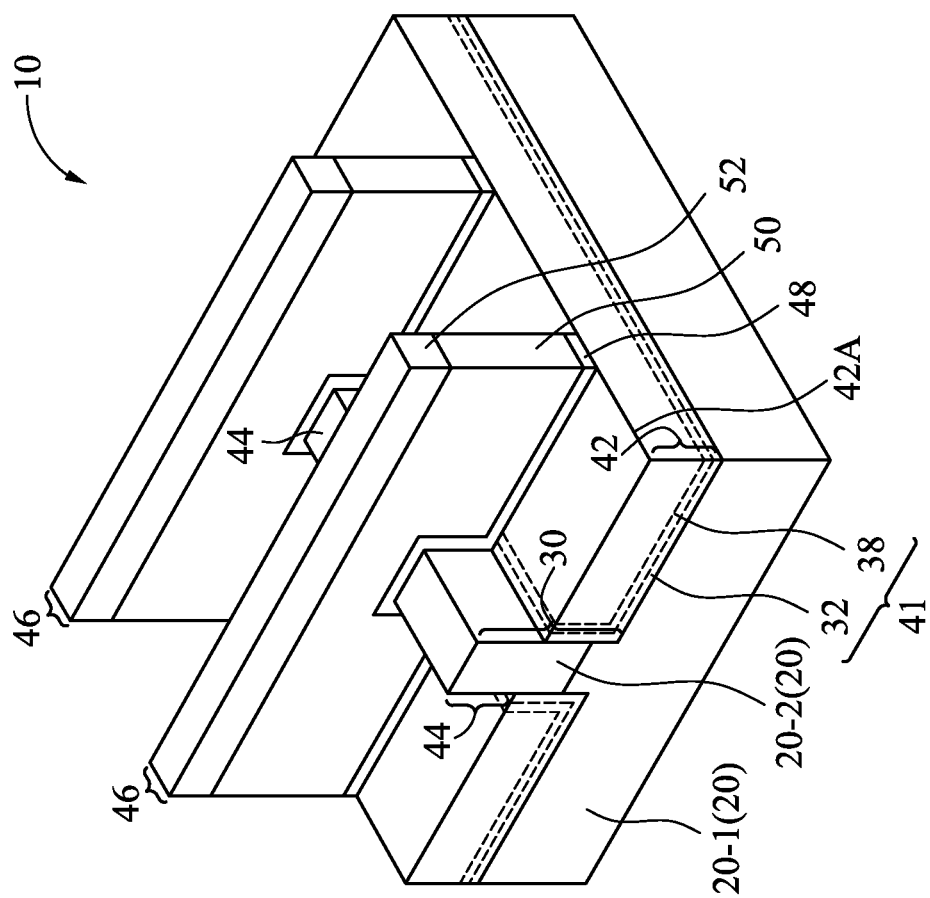

Referring to FIG. 7, dummy gate stacks 46 are formed to cross protruding fin 44. The respective process is illustrated as process 218 in the process flow 200 as shown in FIG. 17. Dummy gate stacks 46 may include dummy gate dielectrics 48 and dummy gate electrodes 50 over dummy gate dielectrics 48. Dummy gate dielectrics 48 may be formed of silicon oxide or other dielectric materials. Dummy gate electrodes 50 may be formed, for example, using polysilicon or amorphous silicon, and other materials may also be used. Each of dummy gate stacks 46 may also include one (or a plurality of) hard mask layer 52 over dummy gate electrode 50. Hard mask layers 52 may be formed of silicon nitride, silicon oxide, silicon carbo-nitride, or multi-layers thereof. Dummy gate stacks 46 may cross over a single one or a plurality of protruding fin 44 and/or STI regions 42. Dummy gate stacks 46 also have lengthwise directions perpendicular to the lengthwise directions of protruding fin 44. The formation of dummy gate stacks 46 includes depositing a dummy gate dielectric layer, depositing a gate electrode layer over the dummy gate dielectric layer, depositing a hard mask layer, and patterning the stack layers to form dummy gate stacks 46.

Figure 8:
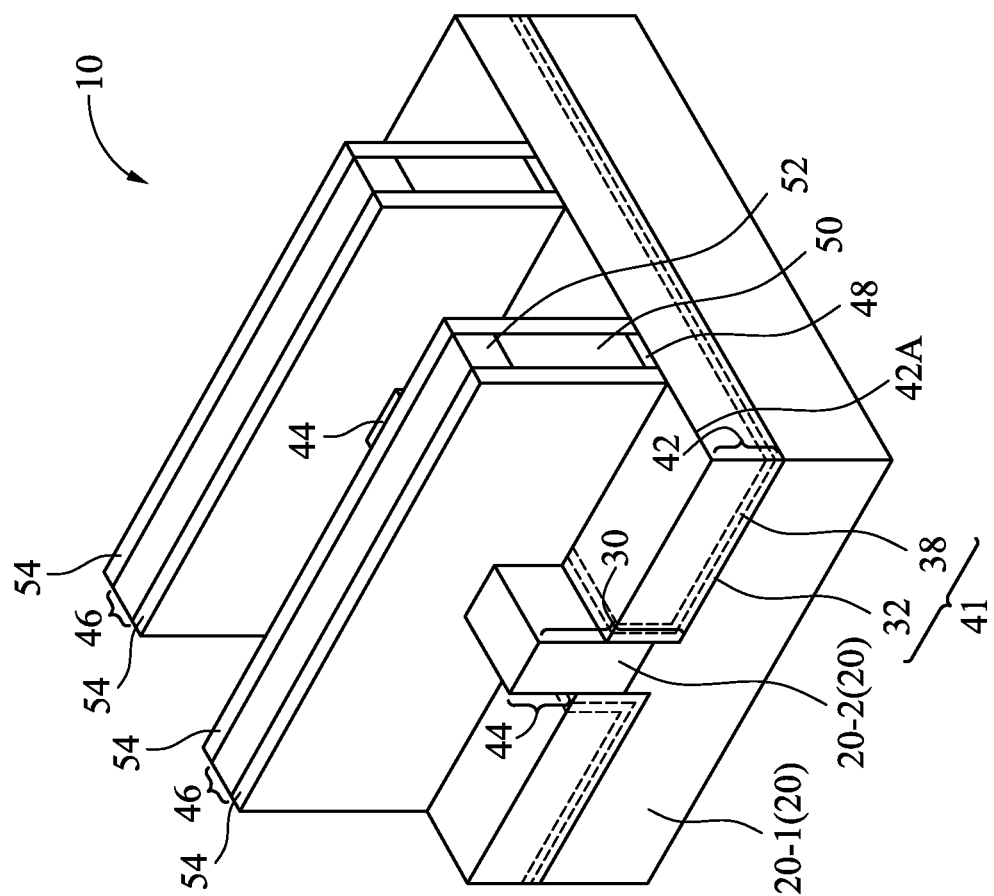

Next, referring to FIG. 8, gate spacers 54 are formed on the sidewalls of dummy gate stacks 46. The respective process is illustrated as process 220 in the process flow 200 as shown in FIG. 17. The formation of gate spacers 54 may include depositing a blanket dielectric layer, and performing an anisotropic etching process to remove the horizontal portions of the dielectric layer, leaving gate spacers 54 to be on the sidewalls of dummy gate stacks 46. In accordance with some embodiments of the present disclosure, gate spacers 54 are formed of an oxygen-containing dielectric material (an oxide) such as $SiO_2$, SiOC, SiOCN, or the like. In accordance with some embodiments of the present disclosure, gate spacers 54 may also include a non-oxide dielectric material such as silicon nitride.

Figure 9:
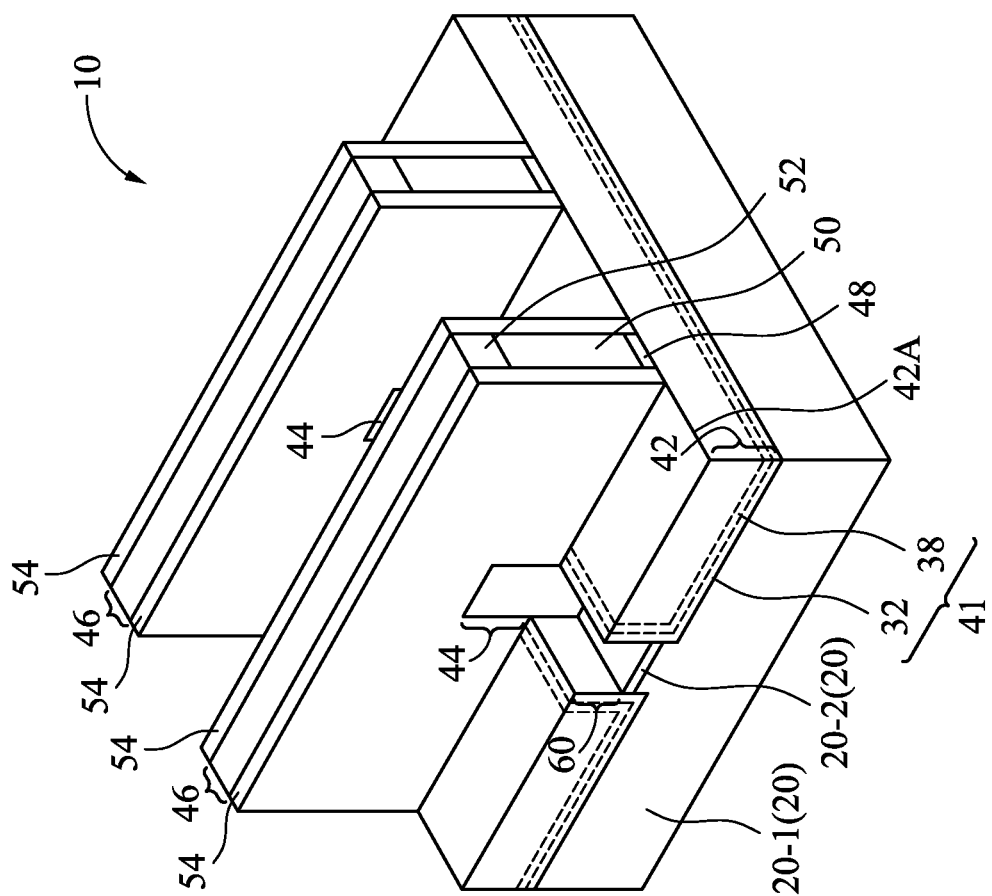

Subsequently, an etching process (referred to as fin recessing hereinafter) is performed to etch the portions of protruding fin 44 that are not covered by dummy gate stacks 46 and gate spacers 54, resulting in the structure shown in FIG. 9. The respective process is illustrated as process 222 in the process flow 200 as shown in FIG. 17. The recessing of protruding fin 44 may be performed through an anisotropic etching process, and hence the portions of protruding fin 44 directly underlying dummy gate stacks 46 and gate spacers 54 are protected, and are not etched. The top surfaces of the recessed semiconductor strip 30 may be lower than the top surfaces 42A of STI regions 42 in accordance with some embodiments. Recesses 60 are accordingly formed between STI regions 42. Recesses 60 are located on the opposite sides of dummy gate stacks 46.

Figure 10:
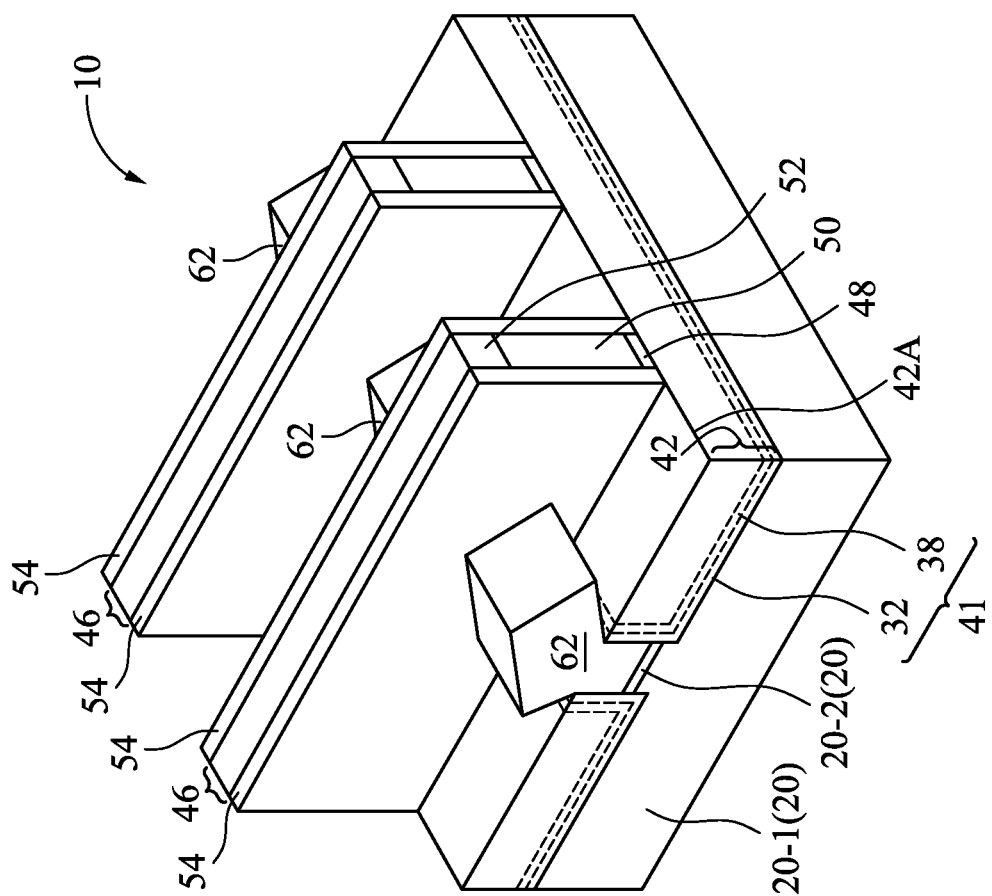

Next, epitaxy regions (source/drain regions) 62 are formed by selectively growing a semiconductor material from recesses 60, resulting in the structure in FIG. 10. The respective process is illustrated as process 224 in the process flow 200 as shown in FIG. 17. In accordance with some embodiments of the present disclosure, epitaxy regions 62 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 62 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 62 fully fill recesses 60, epitaxy regions 62 start expanding horizontally, and facets may be formed.

After the epitaxy step, epitaxy regions 62 may be further implanted with a p-type or an n-type impurity to form source and drain regions, which are also denoted using reference numeral 62. In accordance with alternative embodiments of the present disclosure, the implantation process is skipped when epitaxy regions 62 are in-situ doped with the p-type or n-type impurity during the epitaxy.

Figure 11:
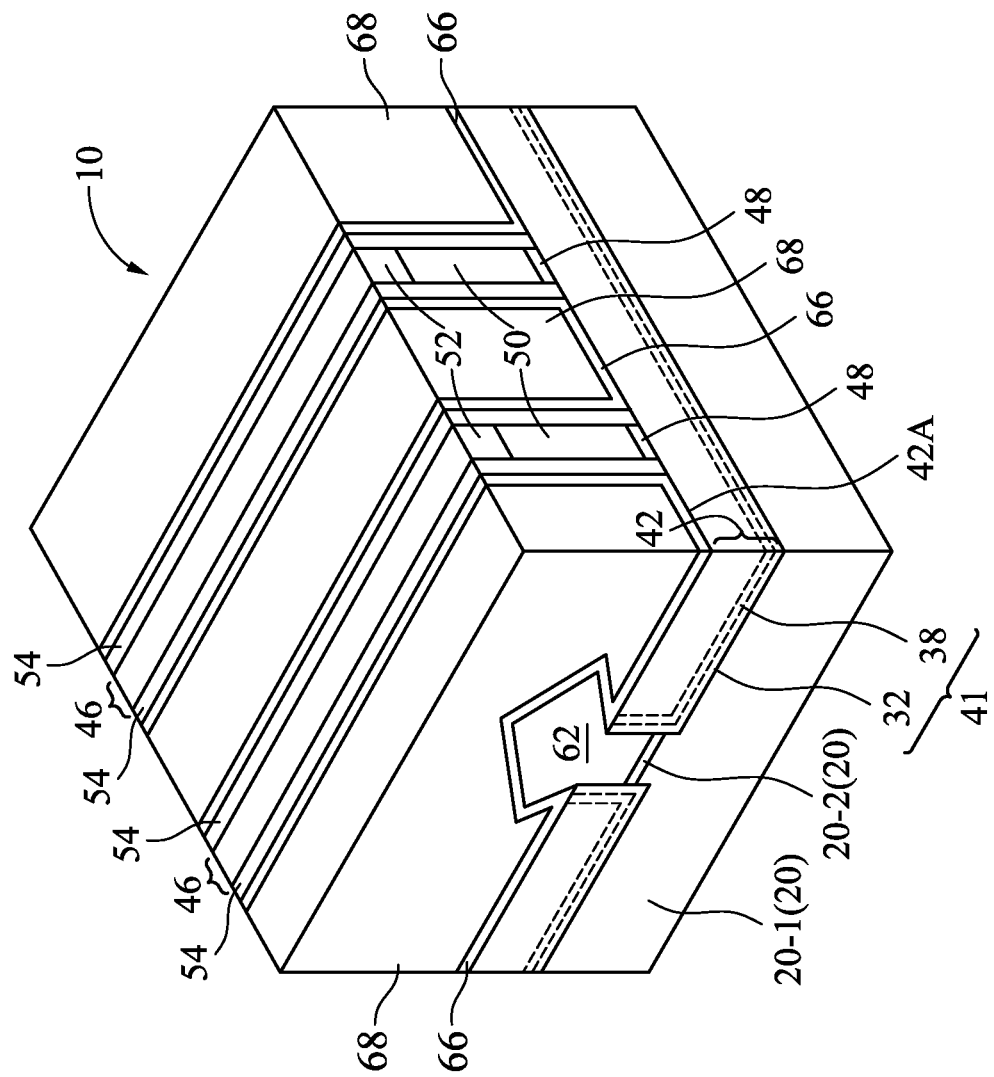

In accordance with alternative embodiments of the present disclosure, instead of recessing protruding fin 44 and re-growing source/drain regions 62, cladding source/drain regions are formed. In accordance with these embodiments, the protruding fin 44 as shown in FIG. 9 is not recessed, and epitaxy regions (not shown) are grown on protruding fin 44. The material of the grown epitaxy regions may be similar to the material of the epitaxy semiconductor material 62 as shown in FIG. 11, depending on whether the resulting FinFET is a p-type or an n-type FinFET. Accordingly, source/drain regions 62 include protruding fin 44 and the epitaxy regions. An implantation process may (or may not) be performed to implant an n-type impurity or a p-type impurity.

FIG. 11 illustrates a perspective view of the structure after the formation of Contact Etch Stop Layer (CESL) 66 and Inter-Layer Dielectric (ILD) 68. The respective process is illustrated as process 226 in the process flow 200 as shown in FIG. 17. CESL 66 may be formed of silicon nitride, silicon carbo-nitride, or the like. CESL 66 may be formed through a conformal deposition process such as ALD or CVD, for example. ILD 68 may include a dielectric material formed using, for example, FCVD, spin-on coating, CVD, or other deposition methods. ILD 68 may also be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process is performed to level the top surfaces of ILD 68, dummy gate stacks 46, and gate spacers 54 with each other. In the formation of ILD 68, an annealing process may be adopted.

Figure 12:
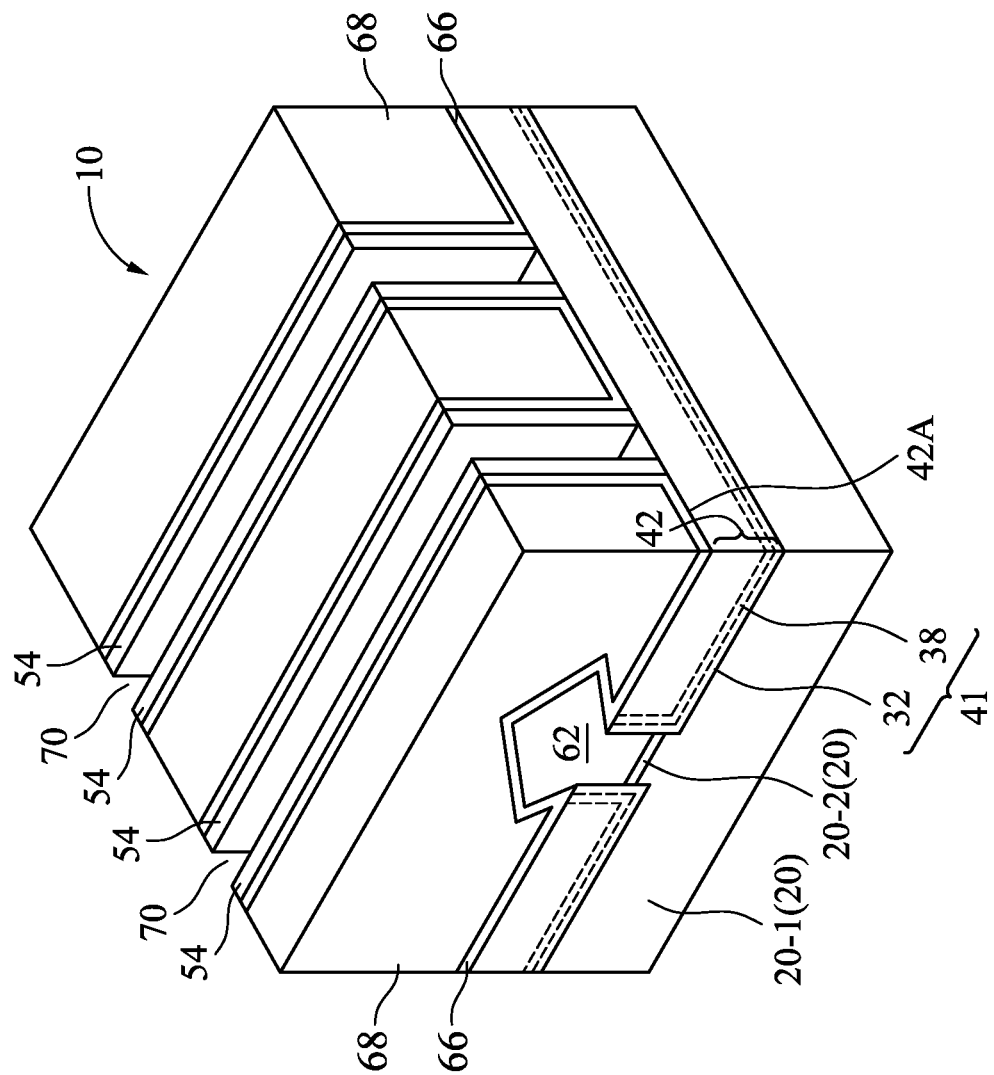

Next, dummy gate stacks 46, which include hard mask layers 52, dummy gate electrodes 50 and dummy gate dielectrics 48, are etched in one or a plurality of etching processes, resulting in trenches 70 to be formed between opposite portions of gate spacers 54, as shown in FIG. 12. The etching process may be performed using, for example, a dry etching process. The etching gases are selected based on the material to be etched. For example, when hard masks 36 include silicon nitride, the etching gas may include fluorine-containing process gases such as $CF_4/O_2/N_2$, $NF_3/O_2$, $SF_6$, or $SF_6/O_2$, or the like. Dummy gate electrodes 50 may be etched using $C_2F_6$, $CF_4$, $SO_2$, the mixture of HBr, $Cl_2$, and $O_2$, or the mixture of HBr, $Cl_2$, $O_2$, and $CF_2$ etc. Dummy gate dielectrics 48 may be etched using the mixture of $NF_3$ and $NH_3$ or the mixture of HF and $NH_3$. If silicon layer 22C (FIG. 1) formed on the sidewalls of dummy gate stacks 46, the silicon layers are also removed.

Figure 13:
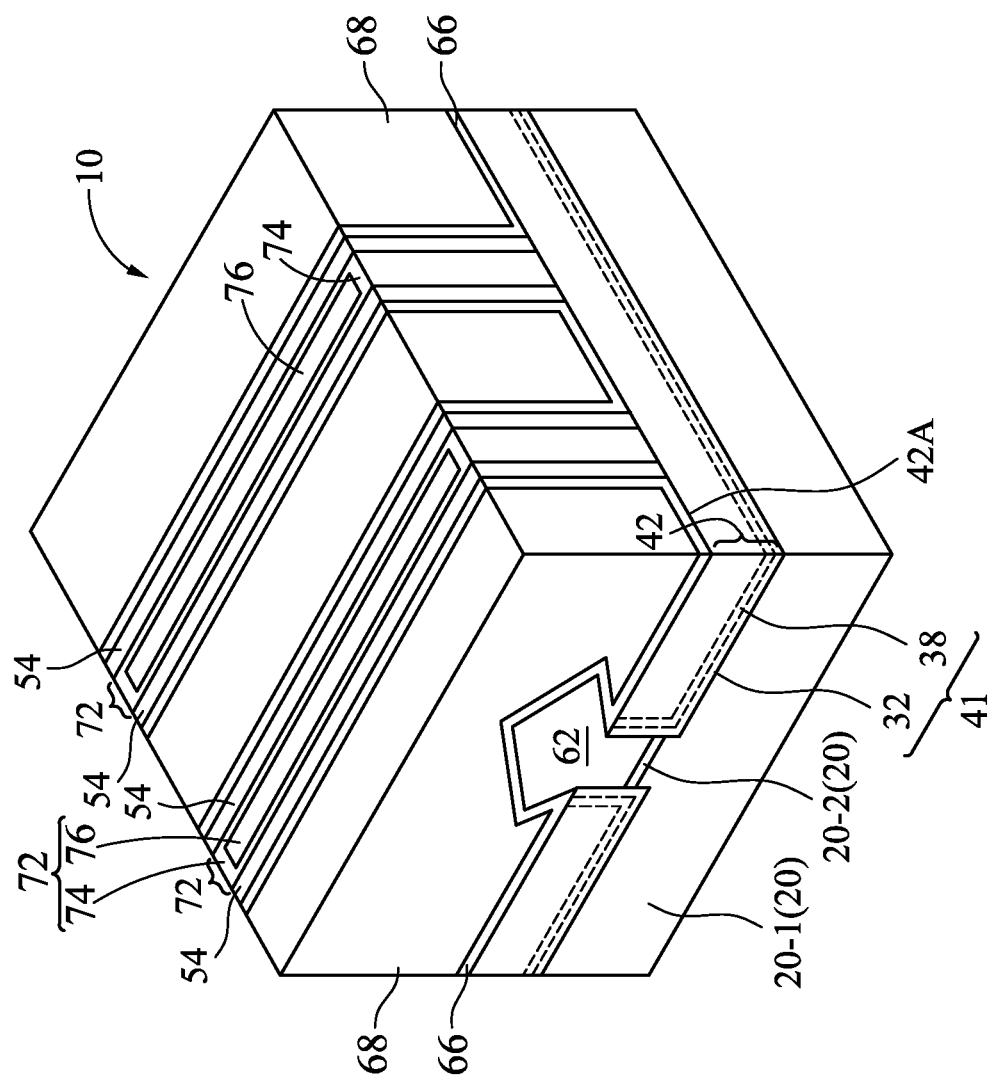

Next, referring to FIG. 13, (replacement) gate stacks 72 are formed, which include gate dielectrics 74 and gate electrodes 76. The respective process is illustrated as process 228 in the process flow 200 as shown in FIG. 17. The formation of gate stacks 72 includes forming/depositing a plurality of layers, and then performing a planarization process such as a CMP process or a mechanical grinding process. Gate dielectrics 74 extend into the trenches 70 (FIG. 13). In accordance with some embodiments of the present disclosure, gate dielectrics 74 include Interfacial Layers (ILs) 78 (FIGS. 16A and 16B) as their lower parts. ILs 78 are formed on the exposed surfaces of protruding fin 44. ILs 78 may include an oxide layer such as a silicon oxide layer, which is formed through the thermal oxidation of protruding fin 44, a chemical oxidation process, or a deposition process. Gate dielectrics 74 may also include high-k dielectric layers 80 (FIGS. 16A and 16B) over ILs 78. High-k dielectric layers 80 may include a high-k dielectric material such as $HfO_2$, $ZrO_2$, HfZrOx, HfSiOx, HfSiON, ZrSiOx, HfZrSiOx, $Al_2O_3$, HfAlOx, HfAlN, ZrAlOx, $La_2O_3$, $TiO_2$, $Yb_2O_3$, silicon nitride, or the like. The dielectric constant (k-value) of the high-k dielectric material is higher than 3.9, and may be higher than about 7.0. High-k dielectric layers 80 are formed as conformal layers, and extend on the sidewalls of protruding fin 44 and the sidewalls of gate spacers 54. In accordance with some embodiments of the present disclosure, high-k dielectric layers 80 are formed using ALD or CVD.

As shown in FIG. 13, gate electrodes 76 are formed on top of gate dielectrics 74, and fill the remaining portions of the trenches left by the removed dummy gate stacks. The sub-layers in gate electrodes 76 are not shown separately in FIG. 14, while in reality, the sub-layers are distinguishable from each other due to the difference in their compositions. The deposition of at least lower sub-layers may be performed using conformal deposition methods such as ALD or CVD, so that the thickness of the vertical portions and the thickness of the horizontal portions of the sub-layers in gate electrodes 76 are substantially equal to each other.

The sub-layers in gate electrodes 76 may include, and are not limited to, a Titanium Silicon Nitride (TSN) layer, a tantalum nitride (TaN) layer, a titanium nitride (TiN) layer, a titanium-and-aluminum-containing layer (such as TiAl or TiAlC), an additional TiN and/or TaN layer, and a filling metal. Some of these layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include aluminum, copper, cobalt, or the like.

Figure 14:
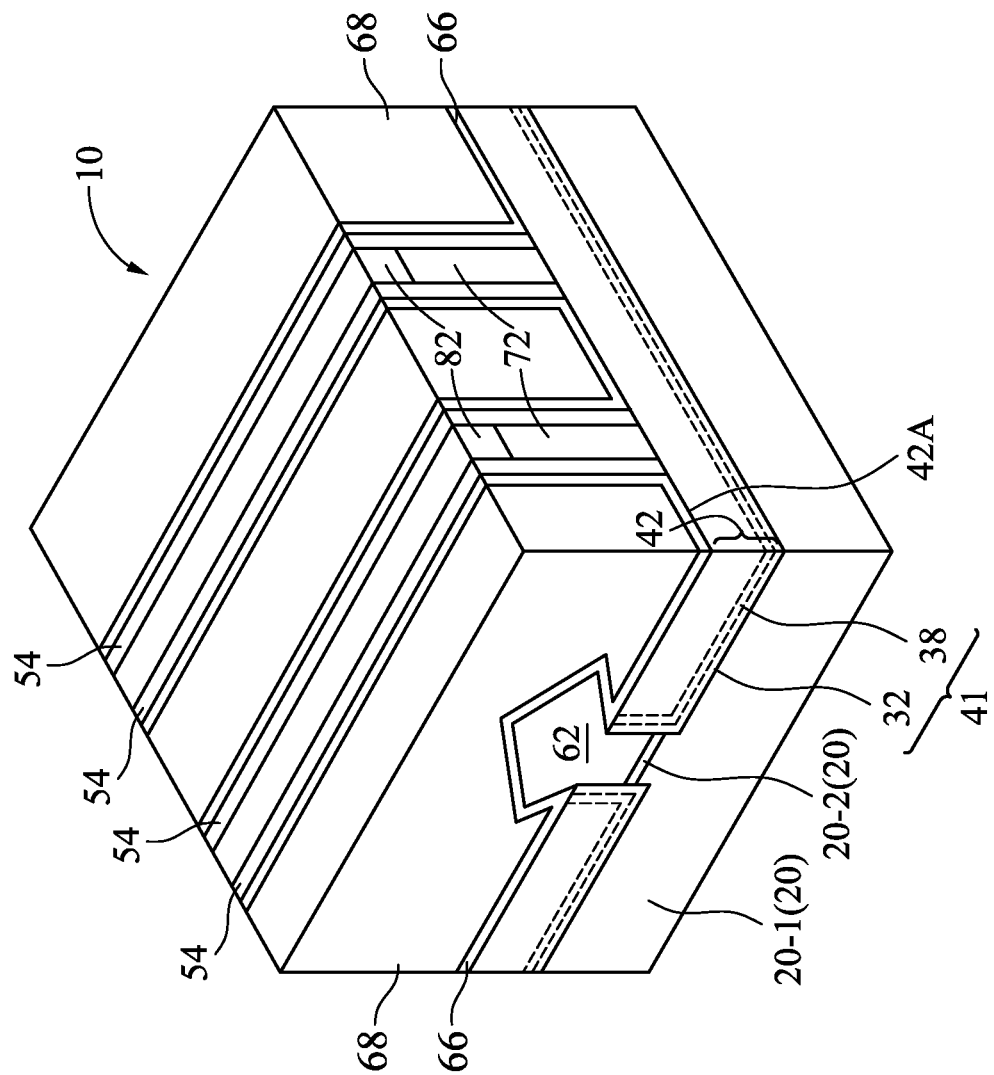

Next, as shown in FIG. 14, hard masks 82 are formed. The respective process is illustrated as process 230 in the process flow 200 as shown in FIG. 17. In accordance with some embodiments of the present disclosure, the formation of hard masks 82 includes recessing replacement gate stacks 72 through etching to form recesses, filling a dielectric material into the recesses, and performing a planarization process to remove the excess portions of the dielectric material. The remaining portions of the dielectric material are hard masks 82. In accordance with some embodiments of the present disclosure, hard masks 82 are formed of silicon nitride, silicon oxynitride, silicon oxy-carbide, silicon oxy-carbonitride, or the like.

FIG. 15 illustrates the subsequent steps for forming contact plugs 86, which includes forming contact openings by etching into ILD 68 and CESL 66 to reveal source/drain regions 62. Silicide regions 84 and source/drain contact plugs 86 are then formed in the contact opening. The respective process is illustrated as process 232 in the process flow 200 as shown in FIG. 17. The top edges of silicon oxide layers 32 and 38 may be in contact with silicide regions 84 or in contact with source/drain contact plugs 86, depending on where silicide regions 84 extend. Alternatively, the top edges of silicon oxide layers 32 and 38 may be in contact with source/drain regions 62.

In a subsequent process, as shown in FIGS. 16A and 16B, etch stop layer 88 is formed, followed by the formation of ILD 90. FIG. 16A shows a cross-sectional view obtained from the same plane that contains line A-A in FIG. 15. In accordance with some embodiments of the present disclosure, etch stop layer 88 is formed of SiN, SiCN, SiC, SiOCN, or another dielectric material. The formation method may include PECVD, ALD, CVD, or the like. The material of ILD 90 may be selected from the same candidate materials (and methods) for forming ILD 68, and ILDs 68 and 90 may be formed of the same or different dielectric materials. In accordance with some embodiments of the present disclosure, ILD 90 is formed using PECVD, FCVD, ALD, spin-on coating, or the like, and may include silicon oxide ($SiO_2$).

ILD 90 and etch stop layer 88 are etched to form openings. The etching may be performed using, for example, Reactive Ion Etch (RIE). Gate contact plug 92 and source/drain contact plugs 94 are formed in the openings to electrically connect to gate electrode 76 and source/drain contact plugs 86, respectively. FinFET 96 is thus formed.

FIG. 16B illustrates a cross-sectional view of FinFET 96 obtained from another plane, which is the same plane that contains line B-B in FIG. 16A. FIG. 16B illustrates silicon oxide layers 32 and 38 relative to other features. In accordance with alternative embodiments, as shown by dashed lines, the bottom portions 34A of silicon layer 34 may exist between silicon oxide layers 32 and 38, as also shown in FIG. 5B.

The embodiments of the present disclosure have some advantageous features. In the formation of isolation region, by depositing silicon liners and then oxidizing the silicon liners into silicon oxide liners, beneficial strain may be improved, and the performance of the resulting transistor is improved.

In accordance with some embodiments of the present disclosure, a method includes method includes etching a semiconductor substrate to form a trench and a semiconductor strip. A sidewall of the semiconductor strip is exposed to the trench. The method further includes depositing a silicon-containing layer extending into the trench, wherein the silicon-containing layer extends on the sidewall of the semiconductor strip, filling the trench with a dielectric material, wherein the dielectric material is on a sidewall of the silicon-containing layer, and oxidizing the silicon-containing layer to form a first liner. The first liner comprises oxidized silicon. The first liner and the dielectric material form parts of an isolation region. The isolation region is recessed, so that a portion of the semiconductor strip protrudes higher than a top surface of the isolation region and forms a semiconductor fin. In an embodiment, the method further comprises, before the silicon-containing layer is deposited, depositing a silicon oxide layer in contact with the sidewall of the semiconductor strip. In an embodiment, the silicon oxide layer is in contact with the silicon-containing layer. In an embodiment, the dielectric material is deposited as a flowable material, and the method further comprises solidifying the flowable material, and wherein the oxidizing the silicon-containing layer is performed by the solidifying the dielectric material. In an embodiment, the silicon-containing layer is fully oxidized into silicon oxide. In an embodiment, the silicon-containing layer has a thickness greater than about 0.5 nm. In an embodiment, the silicon-containing layer is deposited using atomic layer deposition.

In accordance with some embodiments of the present disclosure, a method includes etching a semiconductor substrate to form a semiconductor strip and a trench, wherein the semiconductor strip is on a side of, and has a first lengthwise direction parallel to, a second lengthwise direction of, the trench, wherein the semiconductor strip comprises silicon and germanium, and a sidewall of the semiconductor strip is revealed, depositing a first liner extending into the trench and contacting the sidewall of the semiconductor strip, wherein the first liner comprises silicon oxide, depositing a second liner on the first liner, wherein the second liner comprises silicon, the second liner extending from a top surface of the semiconductor substrate to a bottom of the trench, depositing a dielectric material to fill the trench, wherein a portion of the second liner is underlying the dielectric material, curing the dielectric material to form an oxide layer; and converting the second liner into a third liner. In an embodiment, the first liner has a thickness in a range between about 5 Å and about 15 Å. In an embodiment, the second liner has a thickness greater than about 0.5 nm. In an embodiment, the second liner comprises amorphous silicon. In an embodiment, the curing the dielectric material and the converting the second liner are performed by a same annealing process. In an embodiment, the method further comprises recessing the first liner, the second liner, and the oxide layer; and forming a gate stack extending over the recessed first liner, the second liner, and the oxide layer. In an embodiment, the second liner is fully converted into silicon oxide.

In accordance with some embodiments of the present disclosure, a method includes depositing a silicon-containing liner into a trench in a semiconductor substrate; oxidizing the silicon-containing liner into a first oxidized silicon liner, so that a ratio of a volume of the first oxidized silicon liner to a volume of the silicon-containing liner is more than 0 and no more than 2.25; depositing a dielectric material into the trench, wherein the first oxidized silicon liner comprises a first portion underlying the dielectric material, and the dielectric material and the first oxidized silicon liner form isolation regions; recessing the isolation regions, wherein a portion of the semiconductor substrate between the recessed isolation regions forms a protruding semiconductor fin; forming a gate dielectric extending over the isolation regions; and forming a gate electrode over the gate dielectric. In an embodiment, the silicon-containing liner comprises crystalline silicon. In an embodiment, the method further comprises, before the silicon-containing liner is deposited, depositing a silicon oxide layer extending into the trench, wherein the silicon-containing liner comprises amorphous silicon. In an embodiment, the oxidizing the silicon-containing liner is performed using a process gas selected from the group consisting of oxygen ($O_2$), water steam, and combinations thereof. In an embodiment, the silicon-containing liner is oxidized after the dielectric material is deposited.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a semiconductor substrate to form a trench and a semiconductor strip, wherein a sidewall of the semiconductor strip is exposed to the trench;
   depositing a silicon-containing layer extending into the trench, wherein a sidewall portion the silicon-containing layer is on the sidewall of the semiconductor strip;
   filling the trench with a dielectric material, wherein the dielectric material is on a sidewall of the silicon-containing layer;
   performing a planarization process to level a first top surface of the dielectric material;
   after the planarization process, oxidizing the silicon-containing layer to form a first liner, wherein an entirety of an upper portion of the sidewall portion is oxidized, and a lower portion of the sidewall portion remains as a semiconductor layer that comprises silicon, wherein the first liner comprises oxidized silicon, and wherein the first liner and the dielectric material form parts of an isolation region; and
   recessing the isolation region, wherein a portion of the semiconductor strip protrudes higher than a second top surface of the isolation region and forms a semiconductor fin.

2. The method of claim 1 further comprising, before the silicon-containing layer is deposited, depositing a silicon oxide layer in contact with the sidewall of the semiconductor strip.

3. The method of claim 2, wherein the silicon oxide layer is in contact with the silicon-containing layer.

4. The method of claim 1, wherein the filling the dielectric material comprises:
   depositing the dielectric material as flowable; and
   before the planarization process, partially solidifying the dielectric material that is flowable, wherein the oxidizing is performed after the planarization process.

5. The method of claim 1, wherein the dielectric material is deposited as a flowable material, and the flowable material is solidified by the step of oxidizing the silicon-containing layer.

6. The method of claim 1, wherein the silicon-containing layer comprises a top portion overlapping the semiconductor strip, and wherein an entirety of the top portion is fully oxidized into silicon oxide by the oxidizing.

7. The method of claim 1, wherein the silicon-containing layer has a thickness greater than about 0.5 nm.

8. The method of claim 1, wherein the silicon-containing layer is deposited using atomic layer deposition.

9. A method comprising:
   etching a semiconductor substrate to form a semiconductor strip and a trench, wherein the semiconductor strip is on a side of, and has a first lengthwise direction parallel to, a second lengthwise direction of, the trench;
   depositing a first liner extending into the trench and contacting a sidewall of the semiconductor strip, wherein the first liner comprises silicon oxide;
   depositing a second liner on the first liner, wherein the second liner comprises silicon, and the second liner comprising:
      a sidewall portion extending from a top surface of the semiconductor substrate to a bottom of the trench, wherein the sidewall portion comprises an upper portion and a lower portion lower than the upper portion; and
      a bottom portion at the bottom of the trench and joined to the lower portion of the sidewall portion;
   depositing a dielectric material to fill the trench, wherein a portion of the second liner is underlying the dielectric material;
   curing the dielectric material to form an oxide layer; and
   converting the second liner into a third liner, wherein an entirety of the upper portion of the sidewall portion of the second liner is oxidized, and wherein the lower portion remains to be a silicon layer.

10. The method of claim 9, wherein a lower portion of the semiconductor strip is free from germanium.

11. The method of claim 9, wherein the second liner has a thickness greater than about 0.5 nm.

12. The method of claim 9 further comprising performing an epitaxy process on a base substrate to form an epitaxy semiconductor layer, with the epitaxy semiconductor layer and the base substrate collectively forming the semiconductor substrate.

13. The method of claim 9, wherein the curing the dielectric material and the converting the second liner are performed by a same annealing process.

14. The method of claim 9 further comprising:
   recessing the first liner, the second liner, and the oxide layer; and
   forming a gate stack extending over the recessed first liner, the second liner, and the oxide layer.

15. The method of claim 14, wherein at a time after the gate stack is formed, a part of the lower portion remains to be the silicon layer.

16. A method comprising:
   depositing a silicon-containing liner into a trench in a semiconductor substrate, wherein the silicon-containing liner comprises a vertical portion and a horizontal portion lower than and joined to the vertical portion, and the horizontal portion comprises a top surface;

oxidizing an entirety of a top portion of the silicon-containing liner into a first oxidized silicon liner, wherein a bottommost end of the top portion is higher than the top surface of the horizontal portion, and wherein a bottom portion of the silicon-containing liner remains after the oxidizing;

depositing a dielectric material into the trench, wherein the first oxidized silicon liner comprises a first portion underlying the dielectric material, and the dielectric material and the first oxidized silicon liner form isolation regions, wherein at a time after the dielectric material is deposited, the bottom portion of the silicon-containing liner remains;

recessing the isolation regions, wherein a portion of the semiconductor substrate between the recessed isolation regions forms a protruding semiconductor fin;

forming a gate dielectric extending over the isolation regions; and forming a gate electrode over the gate dielectric to form a transistor, wherein at a time the transistor is formed, the bottom portion of the silicon-containing liner is oxidized.

17. The method of claim 16, wherein the silicon-containing liner comprises crystalline silicon.

18. The method of claim 16 further comprising, before the silicon-containing liner is deposited, depositing a silicon oxide layer extending into the trench, wherein the silicon-containing liner comprises amorphous silicon.

19. The method of claim 16, wherein the oxidizing the silicon-containing liner is performed using a process gas selected from the group consisting of oxygen ($O_2$), water steam, and combinations thereof.

20. The method of claim 16, wherein, at a time the dielectric material is deposited, a horizontal portion of the silicon-containing liner contacting a top surface of the semiconductor substrate remains as being a silicon-containing semiconductor layer.

* * * * *